(12) United States Patent
Belady et al.

(10) Patent No.: US 7,821,792 B2
(45) Date of Patent: Oct. 26, 2010

(54) CELL BOARD INTERCONNECTION ARCHITECTURE

(75) Inventors: Christian L. Belady, McKinney, TX (US); Eric Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/932,153

(22) Filed: Oct. 31, 2007

(65) Prior Publication Data

US 2008/0055847 A1 Mar. 6, 2008

Related U.S. Application Data

(62) Division of application No. 11/039,156, filed on Jan. 20, 2005, now abandoned.

(60) Provisional application No. 60/553,386, filed on Mar. 16, 2004.

(51) Int. Cl.
H05K 5/00 (2006.01)
H05K 7/00 (2006.01)
H05K 1/14 (2006.01)
H05K 1/00 (2006.01)

(52) U.S. Cl. .................. 361/735; 361/679.01; 361/729; 361/736; 439/65

(58) Field of Classification Search ................ 361/686, 361/694, 725, 726, 735, 748, 785, 788, 802, 361/679.01, 729, 730, 736; 439/65

See application file for complete search history.

(56) References Cited

U.S. PATENT DOCUMENTS

| 4,892,376 | A | | 1/1990 | Whitehouse |
| 5,134,508 | A | | 7/1992 | Corda |
| 5,211,565 | A | * | 5/1993 | Krajewski et al. ............. 439/65 |
| 5,280,551 | A | * | 1/1994 | Bowen ......................... 385/53 |
| 5,289,694 | A | * | 3/1994 | Nordin ...................... 62/259.2 |
| 5,335,146 | A | * | 8/1994 | Stucke ......................... 361/785 |
| 5,641,294 | A | | 6/1997 | Beard |
| 5,896,473 | A | * | 4/1999 | Kaspari ........................ 385/24 |
| 6,122,176 | A | | 9/2000 | Clements |
| 6,247,078 | B1 | | 6/2001 | Ebert et al. |
| 6,422,876 | B1 | * | 7/2002 | Fitzgerald et al. ............. 439/61 |
| 6,452,789 | B1 | | 9/2002 | Pallotti et al. |
| 6,540,522 | B2 | | 4/2003 | Sipe |
| 6,639,795 | B1 | * | 10/2003 | Cooper ........................ 361/692 |
| 6,922,342 | B2 | * | 7/2005 | Doblar et al. ................ 361/736 |
| 2001/0046794 | A1 | * | 11/2001 | Edholm ........................ 439/61 |
| 2002/0181215 | A1 | * | 12/2002 | Guenthner ................... 361/784 |
| 2003/0100198 | A1 | * | 5/2003 | Hicks et al. .................... 439/65 |

OTHER PUBLICATIONS

Fowler, M., "Virtual Midplane Realizes Ultrafast Card Interconnects", Electronic Design, 7 pp. [online] retrieved Jan. 19, 2005 from: file://C:\Documents%20and%20Settings/gm01942/Local%20Settings\Temporary%internet%20Files/.

* cited by examiner

*Primary Examiner*—Jayprakash N Gandhi
*Assistant Examiner*—Anthony M Haughton

(57) ABSTRACT

According to at least one embodiment, a cell board interconnection architecture comprises an interconnection structure for interconnecting a plurality of cell boards, the interconnection structure configured to allow air to pass therethrough in a direction in which the cell boards couple therewith.

9 Claims, 34 Drawing Sheets

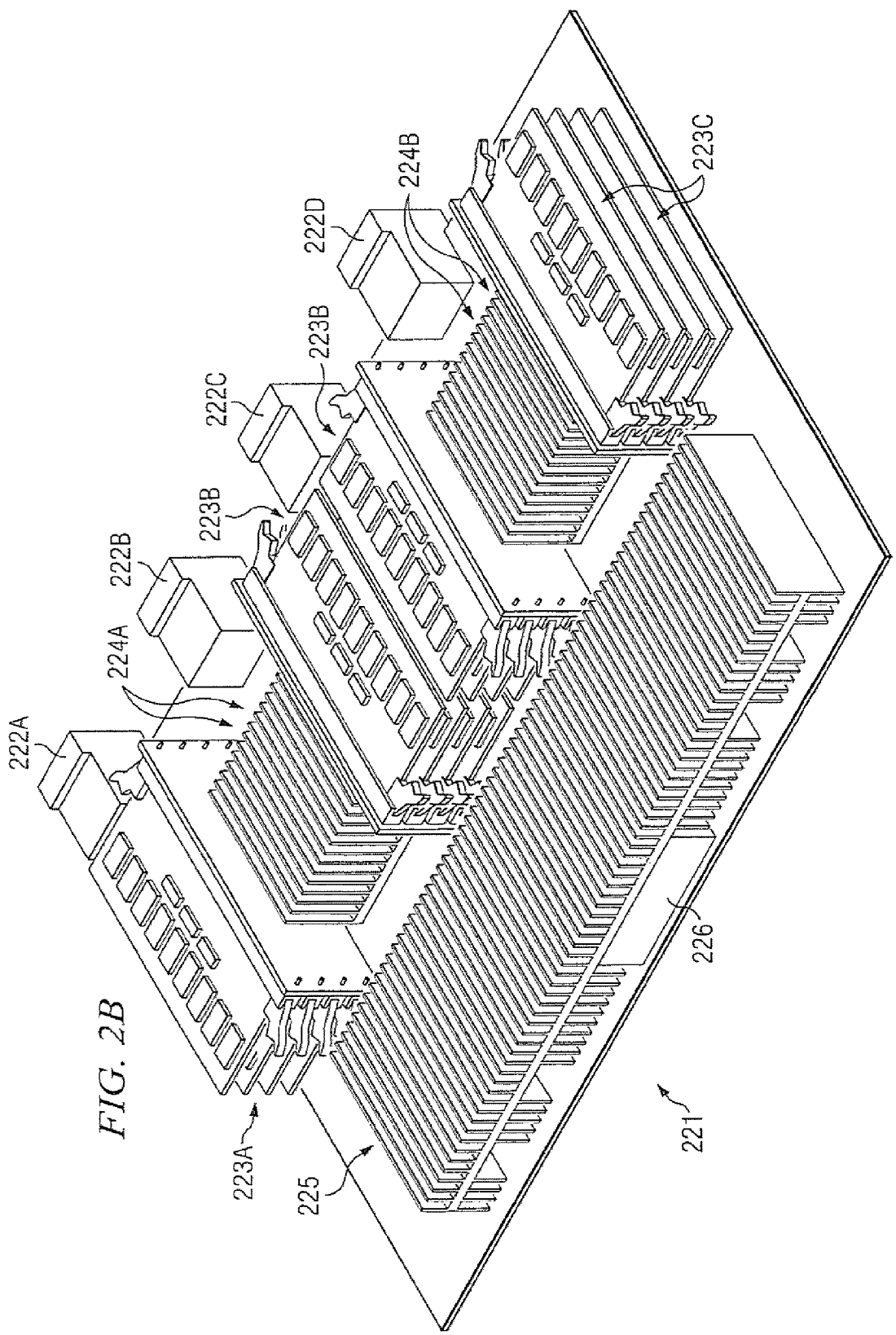

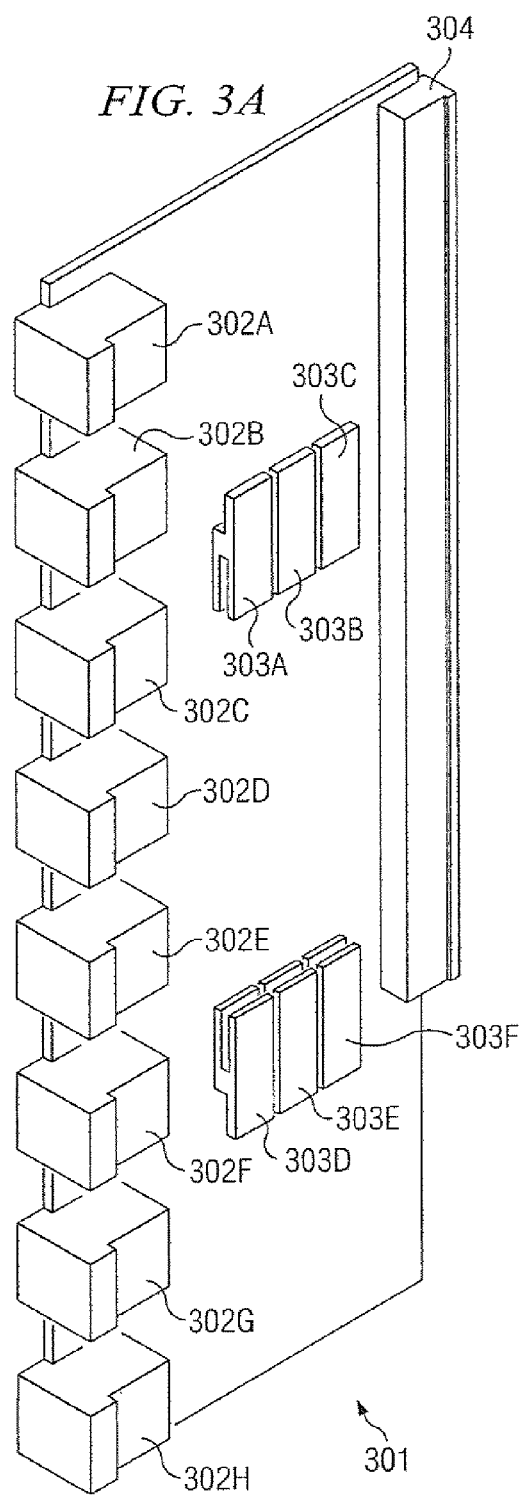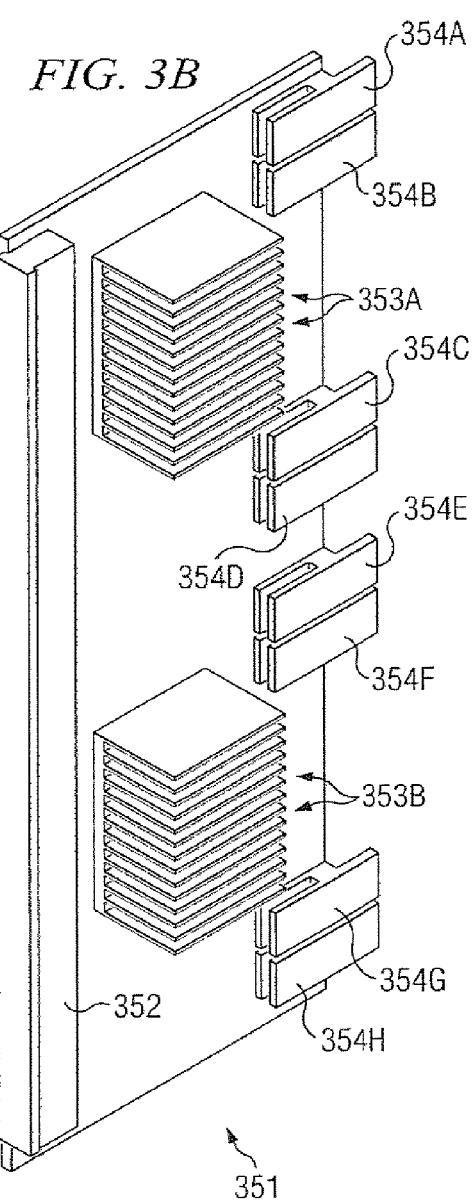

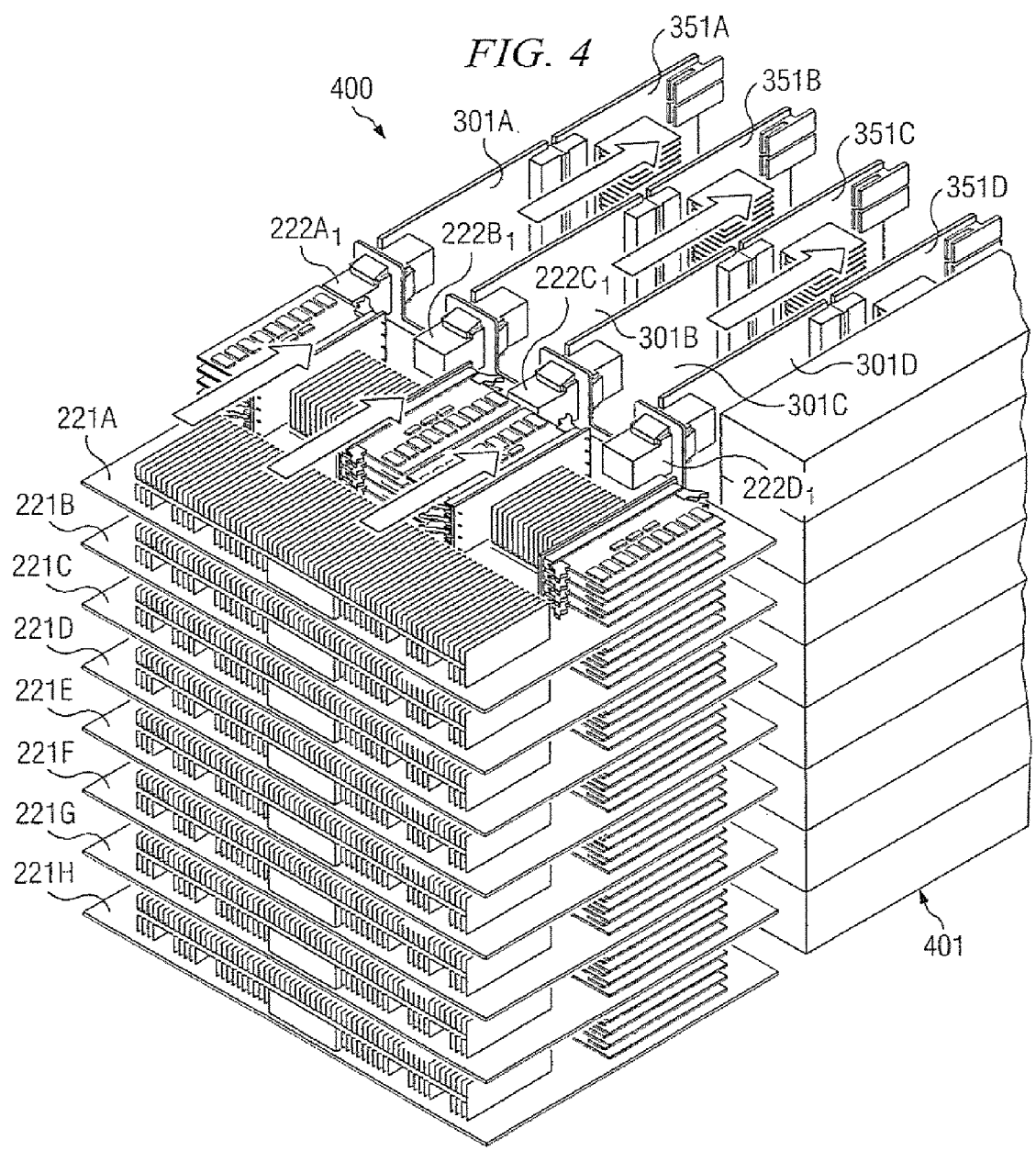

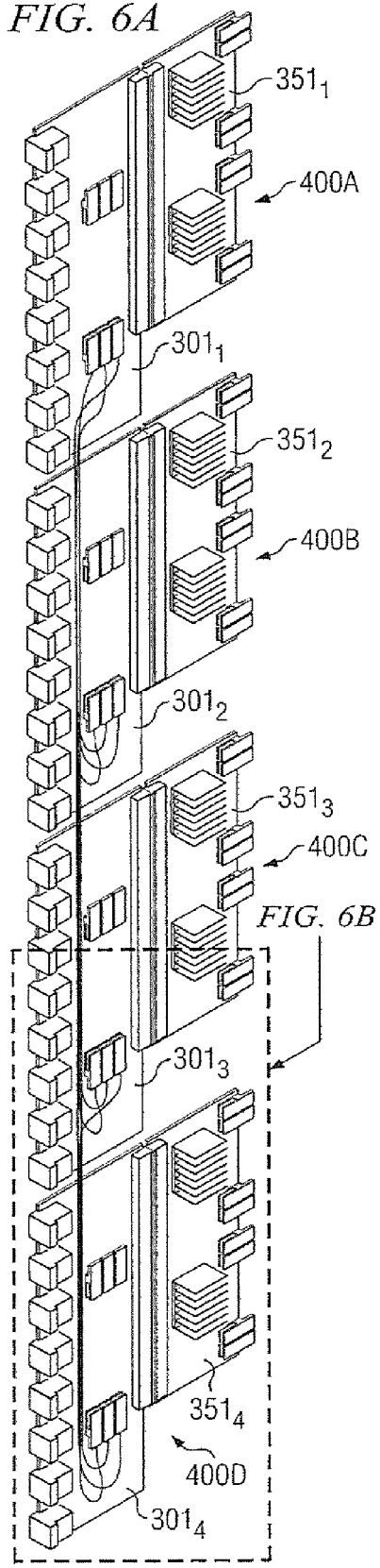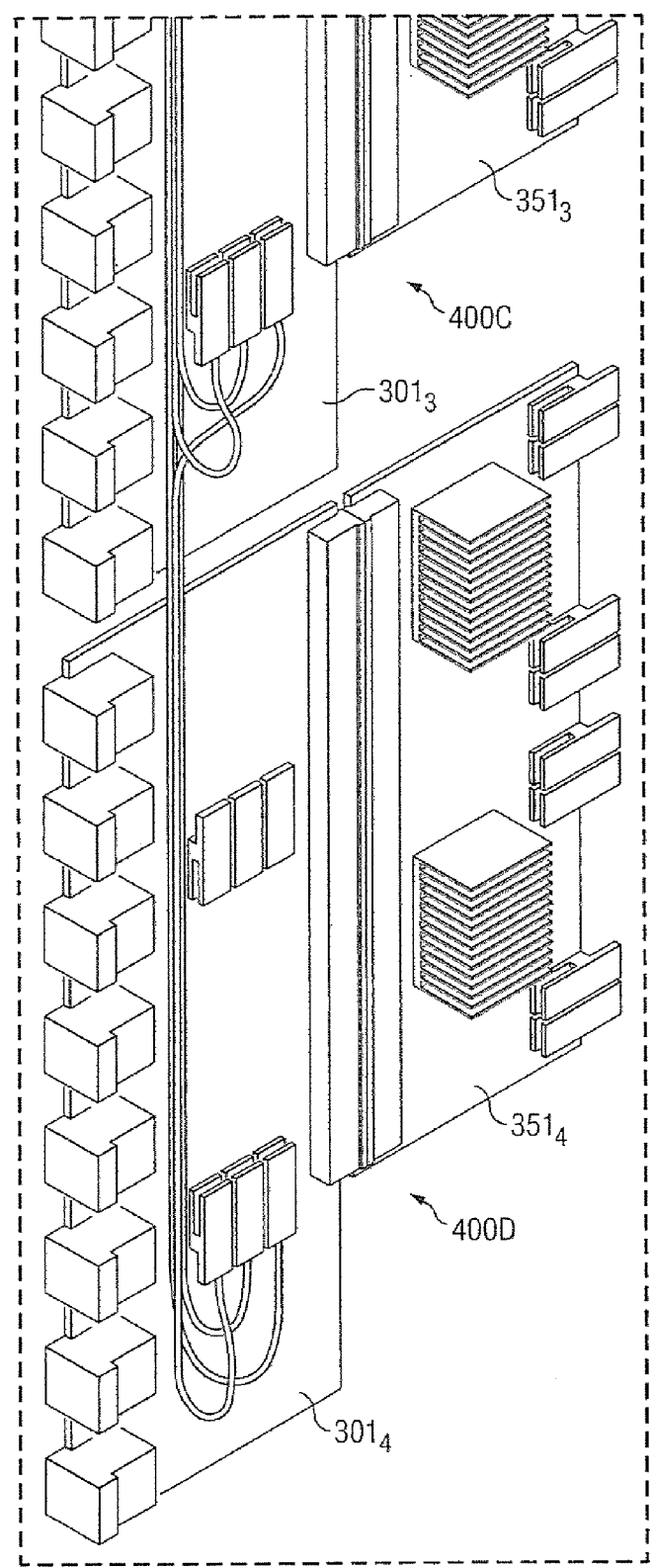

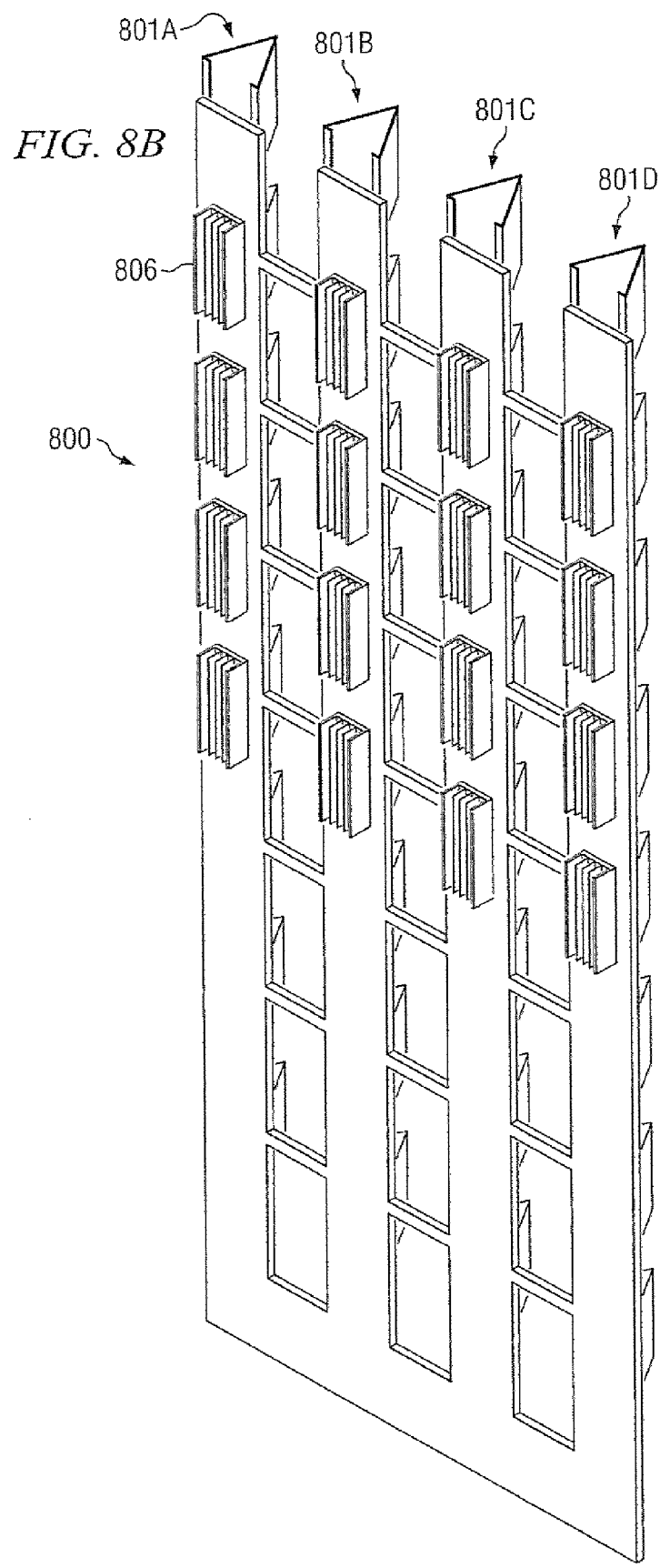

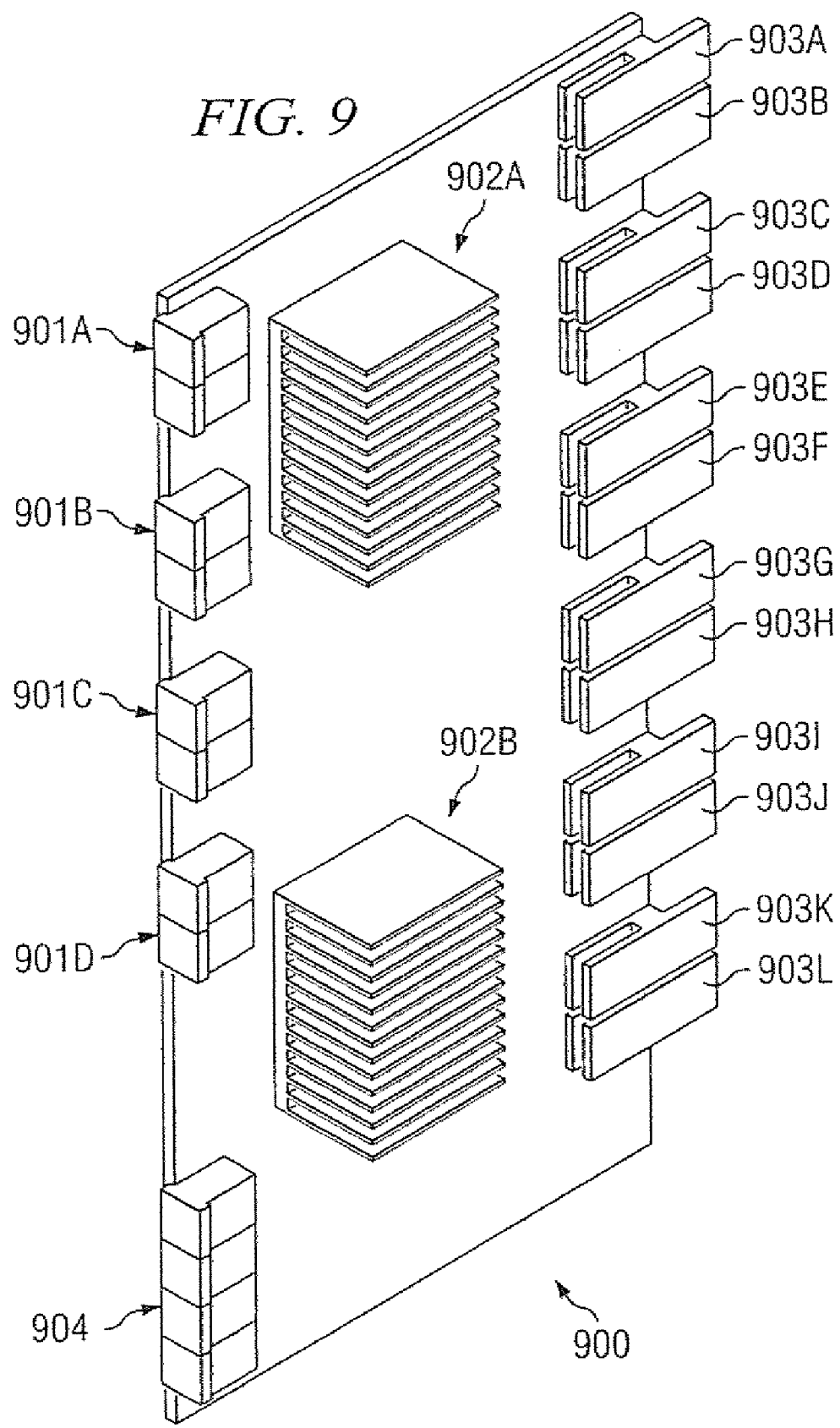

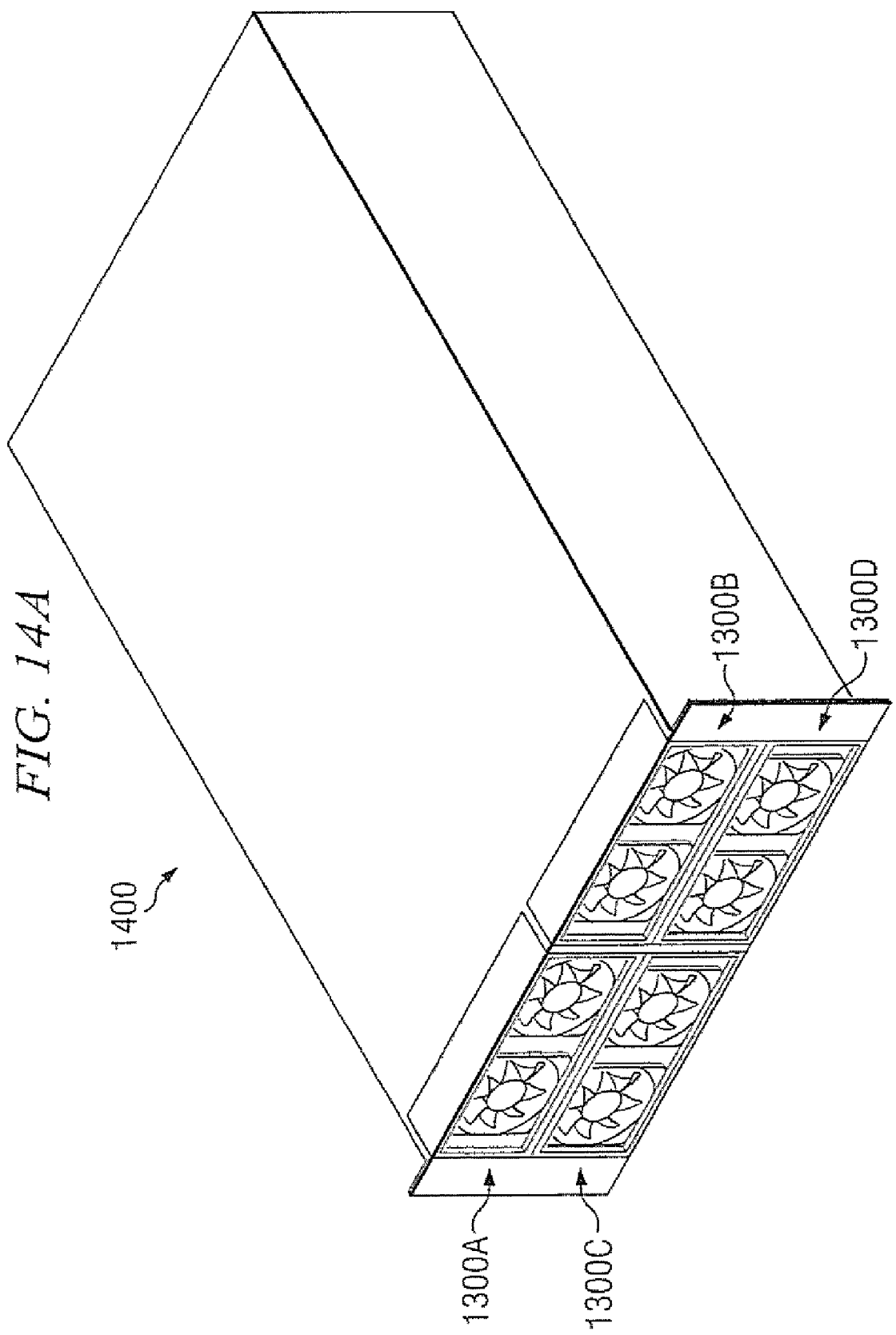

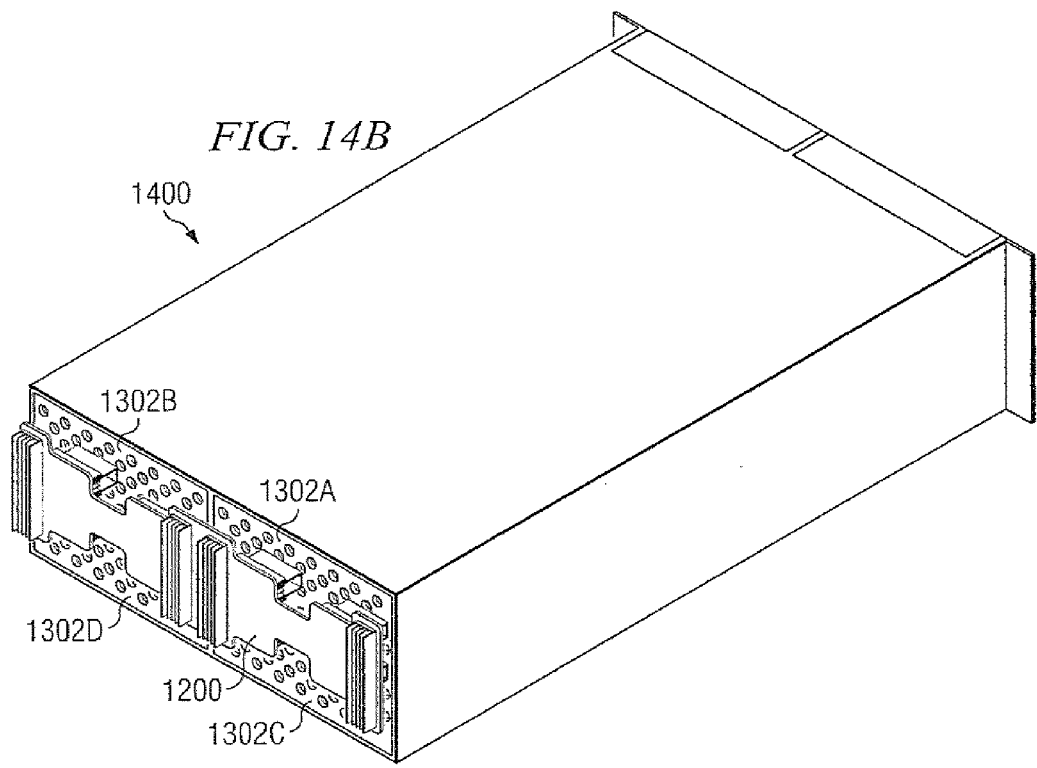
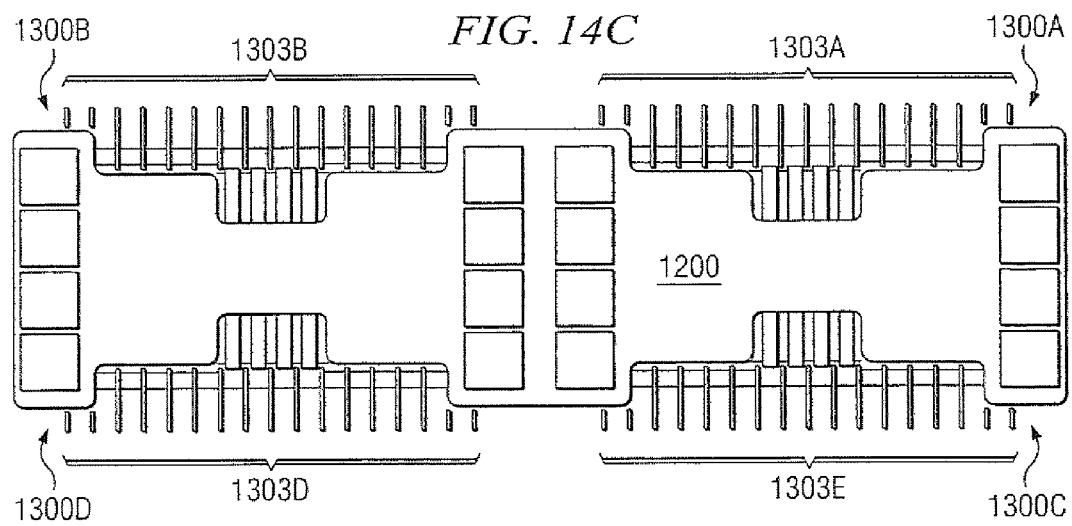

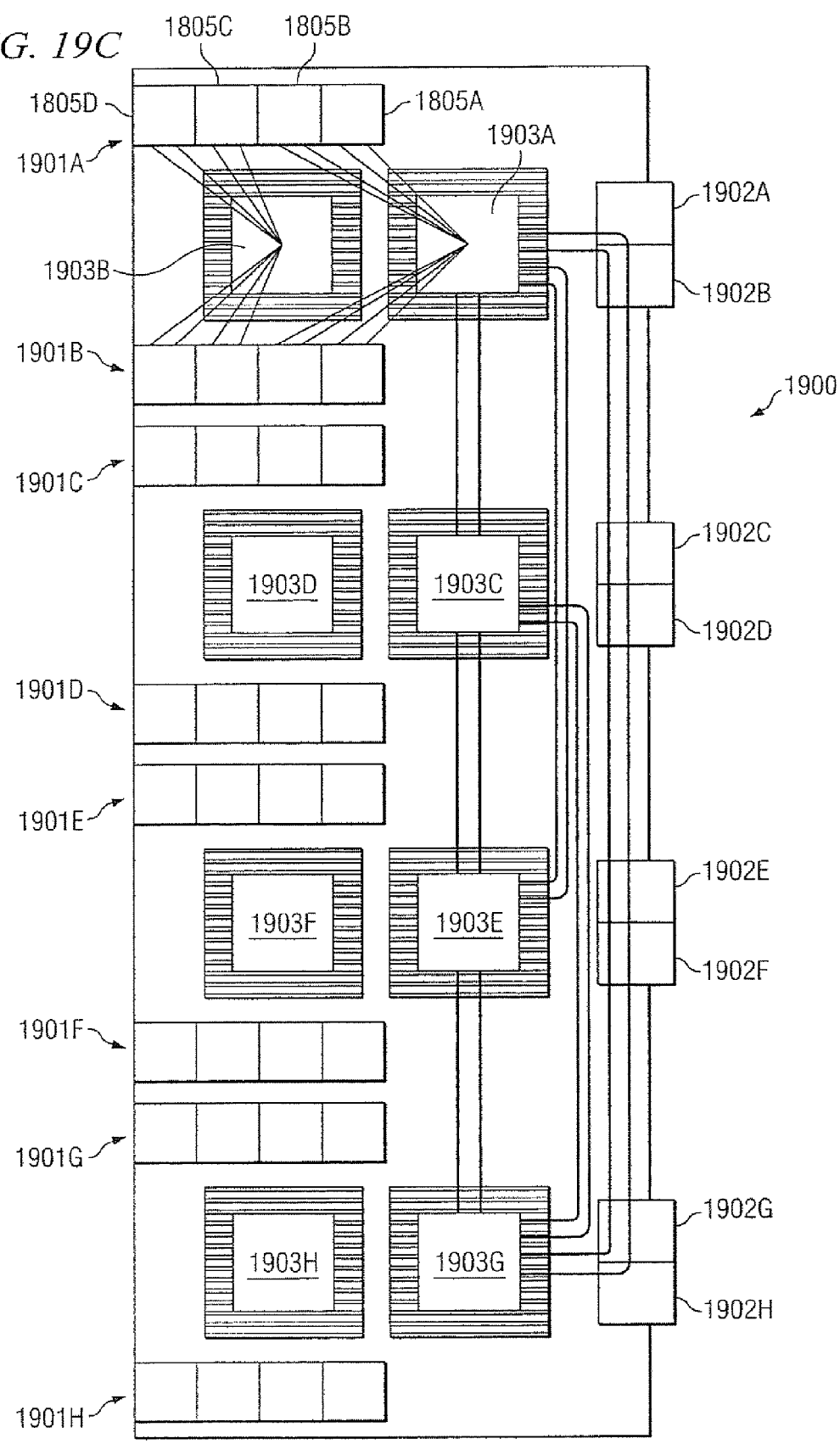

CELL BOARD INTERCONNECTION ARCHITECTURE

CROSS REFERENCE TO RELATED APPLICATIONS

This application is a divisional of U.S. patent application Ser. No. 11/039,156 entitled CELL BOARD INTERCONNECTION ARCHITECTURE, the disclosure of which is hereby incorporated herein by reference, and this application claims priority to U.S. Provisional Patent Application Ser. No. 60/553,386 entitled CELL BOARD INTERCONNECTION ARCHITECTURE, filed Mar. 16, 2004, the disclosure of which is hereby incorporated herein by reference.

BACKGROUND

Cell boards are the building blocks for multi-processor computer systems. Cell boards may include such components as processor(s), memory, application specific integrated circuits (ASICs), and/or input/output (I/O) components. For instance, processor boards, memory boards, and I/O boards may be arranged in a system to form a desired configuration. Further, a single cell board may include a plurality of different types of components. For example, a cell board may include one or more processors, ASIC(s), memory subsystem, and in some cases a power subsystem.

The most common method of interfacing cell boards in a computer system is to provide each cell board with a bus connector and to plug each cell board's bus connector into a matching socket or "slot" mounted to a backplane or motherboard. In general, a backplane provides a communicative interconnection for a plurality of cell boards that are coupled to the backplane. The backplane itself is typically a circuit card that contains sockets to which other cell boards (or "circuit cards") can be connected. Backplanes may be either active or passive. Active backplanes typically contain, in addition to the sockets, logical circuitry that performs computing functions. In contrast, passive backplanes contain almost no computing circuitry. When multiple cell boards are connected to a single backplane, the resulting arrangement is often referred to as a cabinet (or "card cage"). In higher-end computer systems of this type, cell boards may be removed and replaced in the cabinet without powering down the backplane or any of the slots except the one corresponding to the cell board being replaced. Thus, such cabinets are often implemented for so-called high-availability systems. An example of cell boards and their arrangement in a cabinet is disclosed in U.S. Pat. No. 6,452,789 titled "PACKAGING ARCHITECTURE FOR 32 PROCESSOR SERVER," the disclosure of which is hereby incorporated herein by reference.

Traditionally, backplanes are implemented as solid structures. For instance, backplanes are typically solid structures that are relatively densely populated with traces and cabling for interconnecting the cell boards coupled thereto. For example, traditional backplanes are generally arranged as a two-dimensional ("2D") plane (e.g., commonly sized approximately 30 inches by 20 inches) to which cell boards couple, and the 2D plane of the backplane interconnects the cell boards coupled thereto. Traditional backplane designs may have several (e.g., 10) routing layers inside the board, wherein each routing layer comprises traces for interconnecting the cell boards that are coupled to the backplane.

In high-end computing systems, a relatively large number of cell boards may be interconnected within cabinet(s). For example, the Superdome™ server available from Hewlett-Packard Company ("HP") is available as a 16-way, 32-way, or 64-way server. The 16-way implementation may comprise four cell boards interconnected via a backplane within a cabinet, wherein each cell board may include four central processing units ("CPUs") for a total of 16 CPUs, and the cell boards may comprise memory (e.g., dual in-line memory modules ("DIMMs")) implemented thereon for a total of 64 gigabytes ("GB") of memory available in the 16-way implementation. The 32-way implementation may comprise eight cell boards interconnected via a backplane within a cabinet, wherein each cell board may include four CPUs for a total of 32 CPUs, and the cell boards may comprise memory (e.g., DIMMs) implemented thereon for a total of 128 GB of memory available in the 32-way implementation. The 64-way implementation may comprise sixteen cell boards interconnected via a backplane within a cabinet, wherein each cell board may include four CPUs for a total of 64 CPUs, and the cell boards may comprise memory (e.g., DIMMs) implemented thereon for a total of 256 GB of memory available in the 32-way implementation. Further, as a greater number of cell boards is desired, multiple cabinets that each comprise multiple cell boards may be coupled together to form a high-end server.

Competing design considerations are often encountered when developing such multi-processor computer systems. One design consideration commonly encountered involves cooling the components within the cabinet(s). Because of the heat generated by the components, some type of cooling system is typically included for cooling the components to prevent overheating and resulting improper or failed operation. Because traditional backplanes are solid structures, as described above, cooling systems typically generate air flow in a direction parallel to the backplane (e.g., bottom-to-top air flow). One technique for implementing bottom-to-top air flow is described in U.S. Pat. No. 6,452,789 titled "PACKAGING ARCHITECTURE FOR 32 PROCESSOR SERVER." Traditional implementations of bottom-to-top air flow (or "front-to-top" air flow, as air may be ingested through the front of the cabinet and re-directed via blowers toward the top of the cabinet) is not optimal for several reasons. First, blowers are typically required for directing the air flow upward, which consume a relatively large amount of space in the cabinets (thus diminishing the space-efficiency of the architecture). Further, as the air moves upward through the cabinet, the air is heated by each cell board that it encounters, thus diminishing the affect of the air in cooling the upper cell board(s). To ensure proper cooling of the upper cell boards, increased air flow is needed, which means that the size of the blowers implemented for generating such increased air flow is undesirably large (and may be undesirably noisy in some architectures).

Another design consideration often encountered in multi-processor computer systems is a desire for an architecture that enables cell boards to be accessed for service (e.g., by a technician). For instance, a cell board may be removable (e.g., hot swappable) from a cabinet for replacing or repairing the cell board. Service access has traditionally been in a direction orthogonal to the system's backplane. For instance, a cell board generally connects orthogonally to a backplane, and such cell board may be connected or removed from the front of a cabinet by moving the cell board in a direction orthogonal to the backplane. Thus, the service access and the air flow are orthogonal to each other in traditional multi-processor computer systems.

SUMMARY

According to at least one embodiment, a cell board interconnection architecture comprises an interconnection structure for interconnecting a plurality of cell boards, the interconnection structure configured to allow air to pass therethrough in a direction in which the cell boards couple therewith.

BRIEF DESCRIPTION OF THE DRAWINGS

FIG. 2B shows another example configuration of a cell board that may be used in the first example embodiment of a cell board interconnection architecture;

FIG. 3A shows an example implementation of an interconnection card that may be used in the first example embodiment of a cell board interconnection architecture;

FIG. 3 shows an example implementation of a switch card that may be used in the first example embodiment of a cell board interconnection architecture;

FIG. 4 shows an example unit that includes cell boards of FIG. 2B interconnected with the interconnection card of FIG. 3A and switch card of FIG. 3B in accordance with the first example embodiment of a cell board interconnection architecture;

FIG. 6 shows an example of a plurality of interconnection cards of FIG. 3A being interconnected in accordance with the first example embodiment of a cell board interconnection architecture;

FIGS. 8A-8B show an example implementation of an interconnection structure that may be used in the second example embodiment of a cell board interconnection architecture;

FIG. 9 shows an example implementation of a switch card that may be used in the second example embodiment of a cell board interconnection architecture;

FIGS. 14A-14C show an example unit that is formed by combining a plurality of the cell boards of FIG. 13 interconnected via an interconnection structure of FIGS. 12A-12B in accordance with the fourth example embodiment of a cell board interconnection architecture;

FIGS. 19A-19C show an example implementation of a switch card that may be used in the fifth example embodiment of a cell board interconnection architecture;

DETAILED DESCRIPTION

Figure 1:
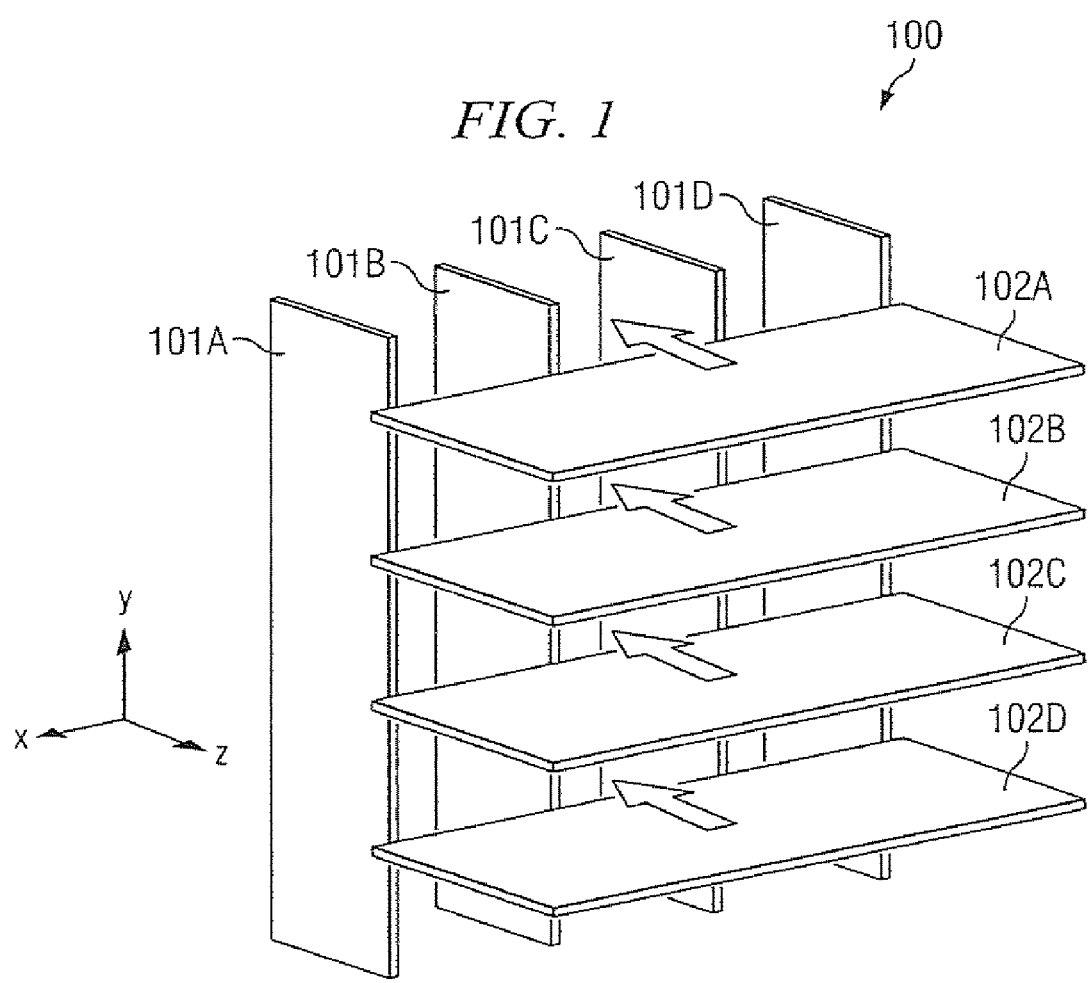
FIG. 1 shows an example of one embodiment of a cell board interconnection architecture.

Various embodiments of a cell board interconnection architecture are now described with reference to the above figures, wherein like reference numerals represent like parts throughout the several views. As described further below, such embodiments provide an interconnection architecture for interconnecting a plurality of cell boards. As opposed to the planar interconnection structure of traditional backplanes, certain embodiments described herein provide a three-dimensional ("3D") interconnection structure or interconnection "volume." This advantageously allows for greater routing opportunity than the 2D backplanes traditionally used for interconnecting cell boards. For example, in certain embodiments the interconnection structure for communicatively interconnecting a plurality of cell boards has a first plane for routing information in at least a first dimension. The interconnection structure further has a second plane that is orthogonal to the first plane for routing information in at least a second dimension that is different from the first dimension. For example, in certain embodiments, a first plane is defined by porous structure or a partial backplane or partial midplane, and a second plane is defined by one or more switches that are coupled to the first plane. In some embodiments the first plane is merely a pass-through plane for passing information to the second plane (e.g., switches). For instance, the first plane may pass information along one dimension from a cell board to a second plane (e.g., switch), and the second plane may pass the information along another dimension to another cell board. Such a 3D interconnection structure may advantageously provide much routing opportunity without sacrificing efficiency and/or compactness of the structure. Various examples of such 3D interconnection structures are described further below.

As also described below, certain embodiments provide an interconnection structure that advantageously enables air to flow through such structure. In some embodiments, for instance, front-to-back air flow may be used for cooling the components of the cell boards, whereby the interconnection structure does not prohibit such front-to-back air flow. Thus, a mechanism, such as a fan or blower, may be implemented to generate a flow of air directed toward the interconnection structure (e.g., front-to-back air flow), and the interconnection structure permits the generated air flow to pass through it. Service access may also be front-to-back, and thus the air flow and service access may be parallel to each other.

In certain embodiments, an interconnection structure is formed by a plurality of interconnection cards, and an architecture is provided in which each of a plurality of cell boards is coupled to multiple ones of the interconnection cards. In some embodiments, the cell boards and interconnection cards may be arranged in a grid (or matrix)-like manner with periodic apertures available through such grid for air to flow through for cooling the cell boards' components. Other features of embodiments of a cell board interconnection architecture are described further below.

In designing a cell board cabinet architecture, various conflicting ergonomic considerations are encountered. For instance, it is generally desirable for the cabinet architecture to provide at least the following features: 1) front access to cell boards (e.g., for ease of access to the cell boards for service), 2) appropriate air flow for cooling the cell boards, and 3) optimum utilization of space by providing a densely populated arrangement of cell boards in a space-efficient architecture. Front access to cell boards is becoming a feature commonly desired in the industry. Such front access to cell boards enables cabinets to be arranged side-by-side, thus allowing for a space-efficient, compact arrangement of the cabinets, while also allowing the cell boards to be easily serviced by a technician by accessing the cell boards from the front (e.g., by coupling and decoupling the cell boards from the front of the cabinet).

Air flow is a problematic design consideration in traditional architectures. Industry standards are developing that dictate that air flow should be front-to-back or front-to-top. For example, standards of the American Society for Heating and Refrigeration Air Conditioning Engineering are emerging that dictate that computers are to have front-to-back or front-to-top cooling. These standards are emerging in an attempt to provide a common air flow for computers so that they can be arranged in a manner such that the computers do not ingest each others' exhaust. That is, by specifying where the exhaust (exiting air flow) is to be on computers, users can decide on an arrangement of their computers such that they do not ingest each others' exhaust. For instance, with front-to-back or front-to-top air flow, computers (or cabinets) may be arranged side-by-side without one computer ingesting the exhaust of another computer. Front-to-back air flow has not been an option in traditional architectures because, as described above, a solid backplane is typically implemented at the back of the cabinet for interconnecting the cell boards, which prevents the flow of air through the back of the cabinet.

Embodiments provided herein enable an architecture in which a plurality of cell boards are interconnected without requiring a solid backplane. Rather, in certain embodiments, a porous backplane is implemented such that front-to-back air flow may be utilized within the architecture. Various architectures are provided that enable interconnection of a plurality of cell boards such that the interconnection does not prohibit (e.g., is transparent to) front-to-back air flow through the architecture. More specifically, in certain embodiments an interconnection structure is provided for interconnecting a plurality of cell boards, wherein air flow is generated in a direction toward the interconnection structure and is permitted to pass through the interconnection structure.

Certain embodiments provide an architecture in which the cell boards and interconnection structure are arranged such that they each provide the least resistance to front-to-back air flow. For instance, they are arranged such that they have the smallest amount of surface area facing the front of the architecture to minimize the amount of surface area that produces resistance to front-to-back air flow. For example, traditional backplanes are oriented such that they have a large surface exposed to the front of the architecture, wherein cell boards connect into connectors arranged on the front-facing surface of the backplane. Generally, the width and height of a backplane provides a plane having a much larger surface area than the plane formed by the thickness and height (or the plane formed by the thickness and width). Thus, if a traditional backplane were rotated by 90 degrees and enabled the cell boards to connect to it along the plane formed by its thickness and height (or its thickness and width), the backplane would present much less resistance to front-to-back air flow because it would have a smaller surface area facing the front of the architecture.

In certain embodiments, a plurality of cell boards are arranged in a first orientation and a plurality of interconnect cards are arranged in a second orientation that is orthogonal to the orientation of the cell boards, and each cell board couples to multiple ones of the plurality of interconnect cards. Such arrangement may be implemented to provide a 3D interconnection architecture that allows for greater routing opportunity for the total size of the architecture. Again, the cell boards and the interconnect cards may each be arranged to allow for front-to-back air flow. For instance, the plane of each cell board's surface having the smallest surface area for blocking front-to-back air flow (e.g., typically the plane formed by the cell board's thickness and height or its thickness and width) is arranged facing the front of the cabinet. Likewise, the plane of each interconnect card's surface having the smallest surface area for blocking front-to-back air flow (e.g. typically the plane formed by the interconnect card's thickness and height or its thickness and width) is arranged facing the front of the cabinet. As described further below, certain embodiments also allow for access to the cell boards (e.g., for servicing, such as removing and/or replacing the cell boards) via the front of the cabinet. Thus, air flow and access to the cell boards may be performed in a common direction (i.e., from the front of the cabinet) in certain embodiments.

As described further below, certain embodiments implement some of the routing responsibility that is traditionally included on backplanes to other structures (e.g., to the cell boards and/or to switch cards), thus enabling the overall size of an interconnection structure to be reduced to allow for porous areas through which air can flow through the interconnection structure and/or enabling short routing distances of signals for improving signal integrity. For instance, in some embodiments, routing of information along one dimension (e.g., horizontal routing) is provided by the interconnection structure, and routing of information along another dimension (e.g., vertical routing) is provided by switch cards coupled to the interconnection structure. In other embodiments, routing of information along one dimension (e.g., vertical routing) is provided by the interconnection structure, and routing of information along another dimension (e.g., horizontal routine) is provided by the cell boards coupled to the interconnection structure. In still another example embodiment, routing of information along one dimension (e.g., vertical routing) is provided by switch cards coupled to the interconnection structure, and routing of information along another dimension (e.g., horizontal routing) is provided by the cell boards coupled to the interconnection structure.

Further, certain embodiments provide an architecture that is modular. That is, the architecture can be readily expanded by combining separate units together. For instance, a "unit" (which may be formed via one or more interconnected cell boards) may comprise 4 processors, and to create a mid-range server that has 8 processors two of the units may be coupled (e.g., stacked) together. A 16-way or 32-way server may be similarly created by continuing to add additional units onto the overall structure. Thus, the architecture enables a manufacturer to readily utilize the architecture in its development of larger-scale systems, rather than requiring a separate architecture for each system. Accordingly, time, effort, and cost associated with producing larger-scale systems may be reduced.

FIG. 1 shows an example of one embodiment of a 3D cell board interconnection architecture. As shown, architecture 100 comprises a plurality of cell boards 102A, 102B, 102C, and 102D that are communicatively interconnected via an interconnection structure that comprises a plurality of interconnection boards 101A, 101B, 101C, and 101D. In this example, cell boards 102A-102D are arranged horizontally being parallel with the plane formed by the X and Z axes shown. The interconnection boards 101A-101D are arranged orthogonal to cell boards 102A-102D. That is, interconnection boards 101A-101D are arranged vertically being parallel with the plane formed by the Y and Z axes shown. It should be recognized that this embodiment enables front-to-back air flow (along the Z axis), as shown by the arrows in FIG. 1. That is, architecture 100 provides a porous interconnection structure, rather than a solid backplane.

As mentioned above, in certain embodiments the horizontal routing of information may be performed along the cell boards 102A-102D, and vertical routing may be performed along the interconnection cards 101A-101D. Thus, the amount of routing provided by the interconnection cards may be less than traditionally provided by a backplane thereby enabling reduction in the size and amount of complexity required on the interconnection cards. For example, a cell board, such as cell board 102A, may comprise a plurality of processors and other components, such as memory, ASICs, etc., and such horizontal routing between components on a cell board may be performed, in certain embodiments, by the cell board itself. The vertical routing from one cell board to another cell board may be performed by an interconnection card.

While FIG. 1 shows one example embodiment, various other architectures may be implemented to enable front-to-back air flow and other desirable features, such as front access, compact design, etc. For instance, one embodiment is described further below in conjunction with FIGS. 2A-6, another embodiment is described further below in conjunction with FIGS. 7-10D, another embodiment is described further below in conjunction with FIG. 11 another embodiment is described further below in conjunction with FIGS. 12A-16, and another embodiment is described further below in conjunction with FIGS. 17-20. Further example embodiments are described below in conjunction with FIGS. 21A-26. It should be recognized that while the example embodiments are described independently below, various features of each embodiment may be implemented as described in a different embodiment (e.g., a cell board or interconnection structure of one embodiment may be implemented in another embodiment). That is, various features described with each embodiment may be interchanged to result ill many other embodiments. Further, the scope of the present invention is not intended to be limited to the example embodiments shown and described herein, but rather the embodiments are intended solely as examples that render the disclosure enabling for many other implementations of the invention defined by the claims appended hereto.

Figure 2A:
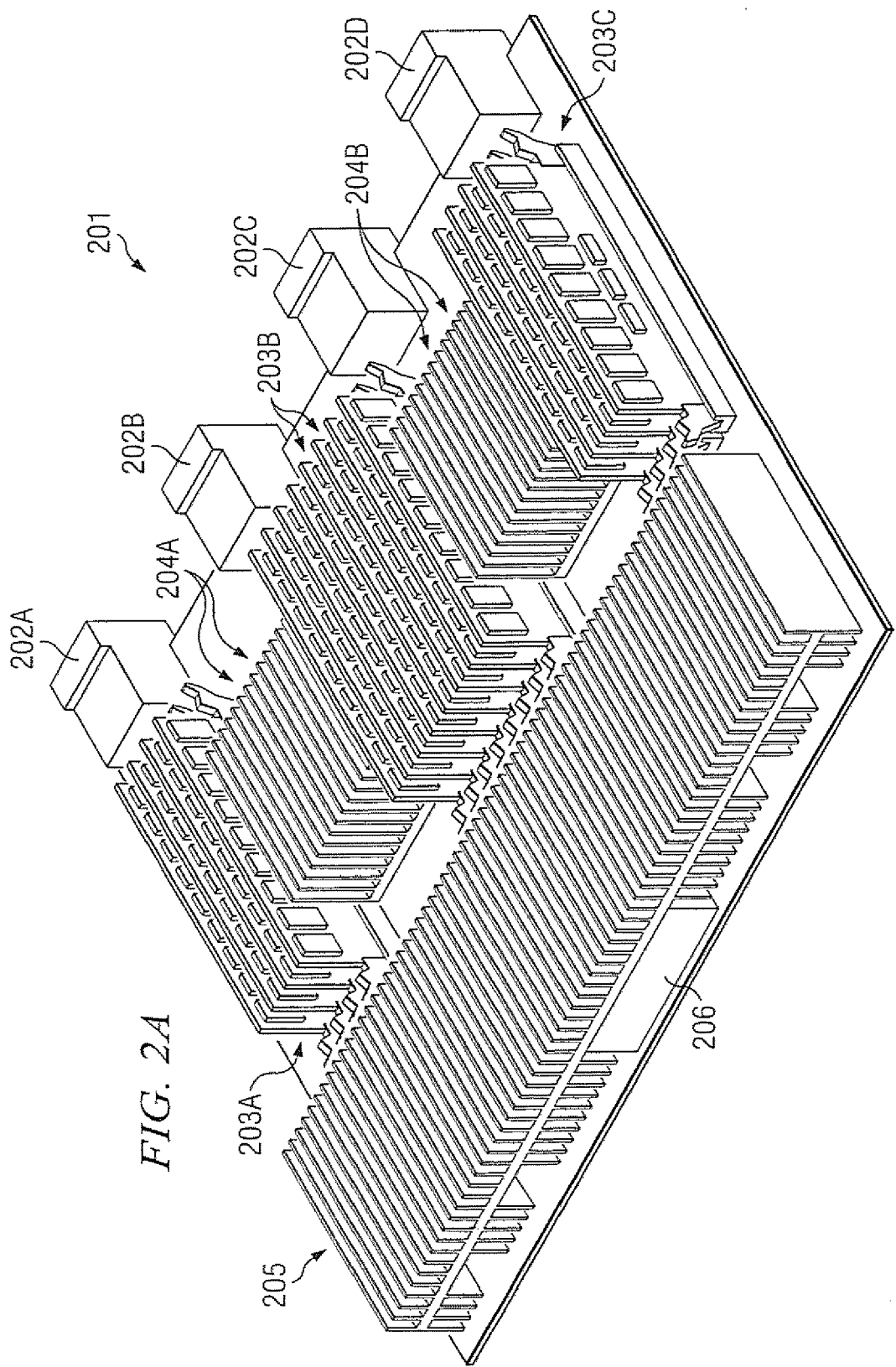
FIG. 2A shows an example configuration of a cell board that may be used in a first example embodiment of a cell board interconnection architecture.

Turning to FIGS. 2A-6, an example embodiment of a cell board interconnection architecture is shown. FIG. 2A shows an example cell board 201 that comprises components 203A, 203B, 203C, 204A, 204B, 205, and 206 implemented thereon. More specifically, in this example configuration cell board 201 comprises processor 206 and memory (e.g., DIMM) 203A-203C. While one processor 206 is shown in this example, a plurality of such processors may be included on cell board 201 in other configurations. Cell board 201 also includes heat sinks 205 in this example. Cell board 201 further includes ASICs 204A-204B (which are shown as being implemented with heat sinks thereon). Such ASICs 204A-204B may, for example, include controller chips for managing communications between components on cell board 201. Cell board 201 further includes connectors 202A, 202B, 202C, and 202D, which in this example configuration are well-known orthogonal connectors, such as the "X-Vector HS High Speed Midplane for Cross-Connection" connector available from Japan Aviation Electronics Industry, Limited ("JAE").

FIG. 2B shows an alternative example cell board 221 that may be implemented, which comprises components 223A, 223B, 223C, 224A, 224B, 225, and 226 implemented thereon. More specifically, in this example configuration cell board 221 comprises processor 226 and memory (e.g., DIMM) 223A-223C. While one processor 226 is shown in this example, a plurality of such processors may be included on cell board 221 in other configurations. Cell board 221 also includes heat sinks 225 in this example Cell board 221 further includes ASICs 224A-224B (which are shown as being implemented with heat sinks thereon). Such ASICs 224A-224B may, for example, include controller chips for managing communications between components on cell board 221.

Thus, cell board 221 comprises the same components as described above with cell board 201 of FIG. 2, but such components are arranged differently. Cell board 221 of FIG. 2B also comprises connectors 222A, 222B, 222C, and 222D, which correspond to connectors 202A, 202B, 202C, and 202D of cell board 201 described above with FIG. 2A. The components are arranged differently in the example configuration of FIG. 2A than their arrangement on the example cell board 201 of FIG. 2A, but it should be recognized that either arrangement of components permits front-to-back air flow in the manner described more fully below. For instance, in the example implementations of FIGS. 2A and 2B, each component is arranged such that it provides the least amount of surface area in the path of the front-to-back air flow (e.g., in the path of air flow directed toward the interconnection structure described below). Thus, the components are arranged to minimize the amount of resistance that they provide to front-to-back air flow.

FIG. 3A shows an example implementation of an interconnection card 301. Interconnection card 301 comprises connectors 302A-302H that are each capable of coupling with a connector of a cell board, such as one of connectors 202A-202D of cell board 201 of FIG. 2A or one of connectors 222A-222D of circuit card 221 of FIG. 2B. Interconnection card 301 also comprises connectors 303A-303F that enable interconnection with a plurality of other interconnection cards 301 (not shown) within a cabinet. Thus, connectors 303A-303F are fabric connectors for a cabinet, as described below with FIG. 6. Interconnection card 301 also comprises connector 304 for coupling to a switch, such as switch card 351 of FIG. 3B.

In certain implementations interconnection cards 301 may be fixed within a unit or cabinet, and cell boards (such as those of FIGS. 2A and 2B) and switch cards (such as that of FIG. 3B described below) may be removably coupled thereto. Thus, for instance, cell boards and/or switch cards may be removed for servicing/repair. In this example embodiment, interconnection card 301 is responsible for performing one-dimensional ("1D") routing. More particularly, interconnection card 301 (and switch card 351 of FIG. 3B) performs vertical (e.g., along the Y axis of FIG. 1) routing of information (e.g., routing of information from one of its connectors 302A-302H) to another of such connectors 302A-302H and/or routing information from one of such interconnection cards 301 to another interconnection card as described with FIG. 6 below). The cell boards are implemented to include the capability of performing horizontal routing (e.g., routing along the X and Z axes of FIG. 1). Thus, in this example embodiment, 3D routing is achieved, but 1D is performed by the interconnection cards (and switch cards) and 2D is performed by the cell boards, rather than being limited to 2D routing that is performed entirely by an interconnection structure (such as with traditional backplanes).

FIG. 3B shows an example switch card 351, which comprises connector 352 for coupling with connector 304 of interconnection card 301 of FIG. 3A. Switch card 351 also comprises components 353A and 353B, which are ASICs or "cross-bar" chips (shown with heat sinks implemented thereon) for managing switching between the various cell boards coupled to interconnection card 301 (i.e., for managing vertical routing within a cabinet). And, switch card 351 comprises cabinet-to-cabinet fabric connectors 354A-354H to enable a plurality of cabinets to be interconnected. Switch card 351 controls the communication between the cell boards coupled to interconnection card 301. That is, switch card 351 arbitrates the routing of information between the cell boards. While interconnection card 301 and switch card 351 are shown as separate cards in this example, which may improve the serviceability of the architecture, in alternative implementations the functionality of those two cards may be implemented as a single card.

Figure 23:
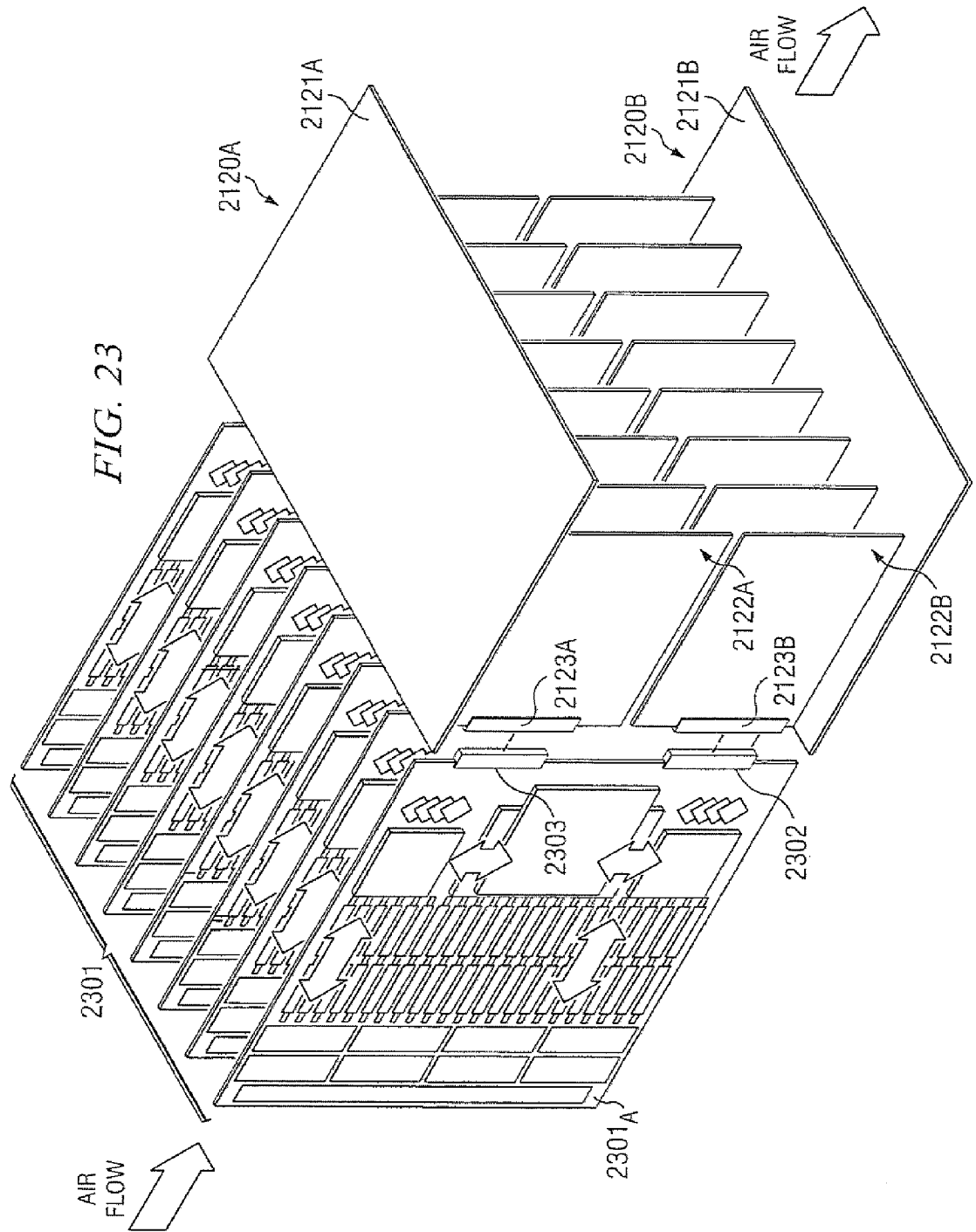
FIG. 23 shows an example of utilizing the example architecture of FIG. 21B for interconnecting a plurality of cell boards.

Turning to FIG. 4, an example unit 400 is shown. In this example architecture 400, a plurality of cell boards 221 of FIG. 23 are implemented, shown as cell boards 221A-221H. As shown, each cell board is coupled to a plurality of interconnection boards 301 of FIG. 3A, shown as interconnection boards 301A-301D. For instance, as can be seen for circuit card 221A, its first connector $222A_1$ is coupled to a first interconnection board 301A; its second connector $222B_1$ is coupled to a second interconnection board 301B; its third connector $222C_1$ is coupled to a third interconnection board 301C; and its fourth connector $222D_1$ is coupled to a fourth interconnection board 301D. Thus, each cell board is coupled to a plurality of different interconnection boards 301A-301D. Also, a switch card 351 of FIG. 3B is coupled to each interconnection board, wherein such switch cards are shown as switch cards 351A-351D. Alternating current ("AC") to direct current ("DC") power supplies ("front-end power supplies") 401 are also included. Such AC to DC power supplies 401 may, for example, convert 208 AC to 48 DC. Of course, any other desired power conversion may be performed in alternative implementations.

Thus, the example unit of FIG. 4 comprises a plurality of cell boards (8 in this implementation) that are communicatively interconnected. Further, it should be recognized that the above architecture enables front-to-back air flow, such as indicated by the arrows shown in FIG. 4. Thus, a mechanism (not shown), such as a fan or blower, may be implemented in the example unit of FIG. 4 to generate a flow of air directed toward the interconnection structure (e.g., front-to-back air flow), and the interconnection structure (e.g., interconnection boards 301A-301D and switch cards 351A-351D) permits the generated air flow to pass through it. It should also be recognized that the architecture of FIG. 4 provides a dense arrangement of cell boards, thus providing a space-efficient architecture, while also allowing the cell boards to be accessed from the front of the architecture (which eases servicing the cell boards).

Figure 5A:
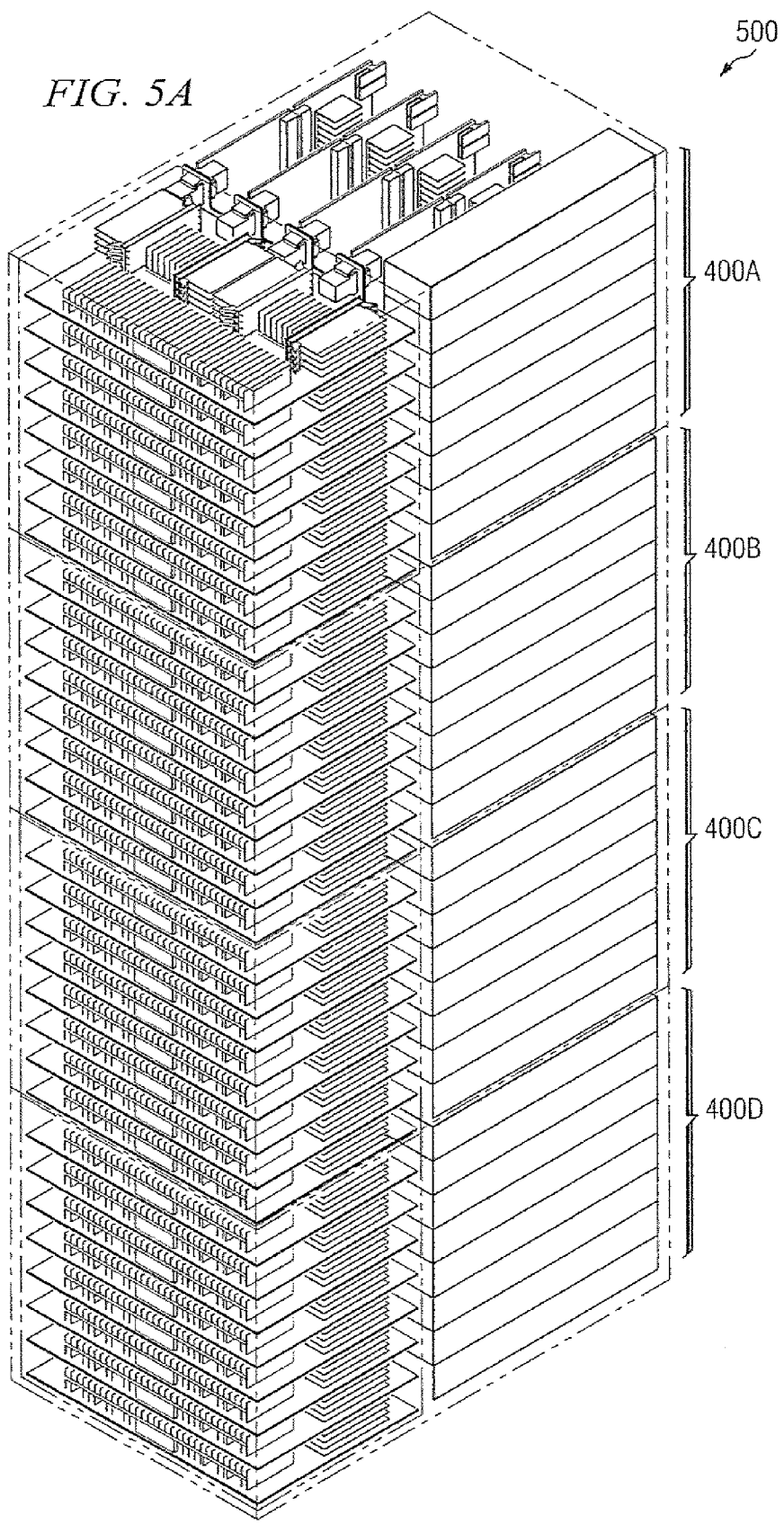
FIGS. 5A-5B show a plurality of the units of FIG. 4 interconnected to form a cabinet in accordance with the first example embodiment of a cell board interconnection architecture.
Figure 5B:
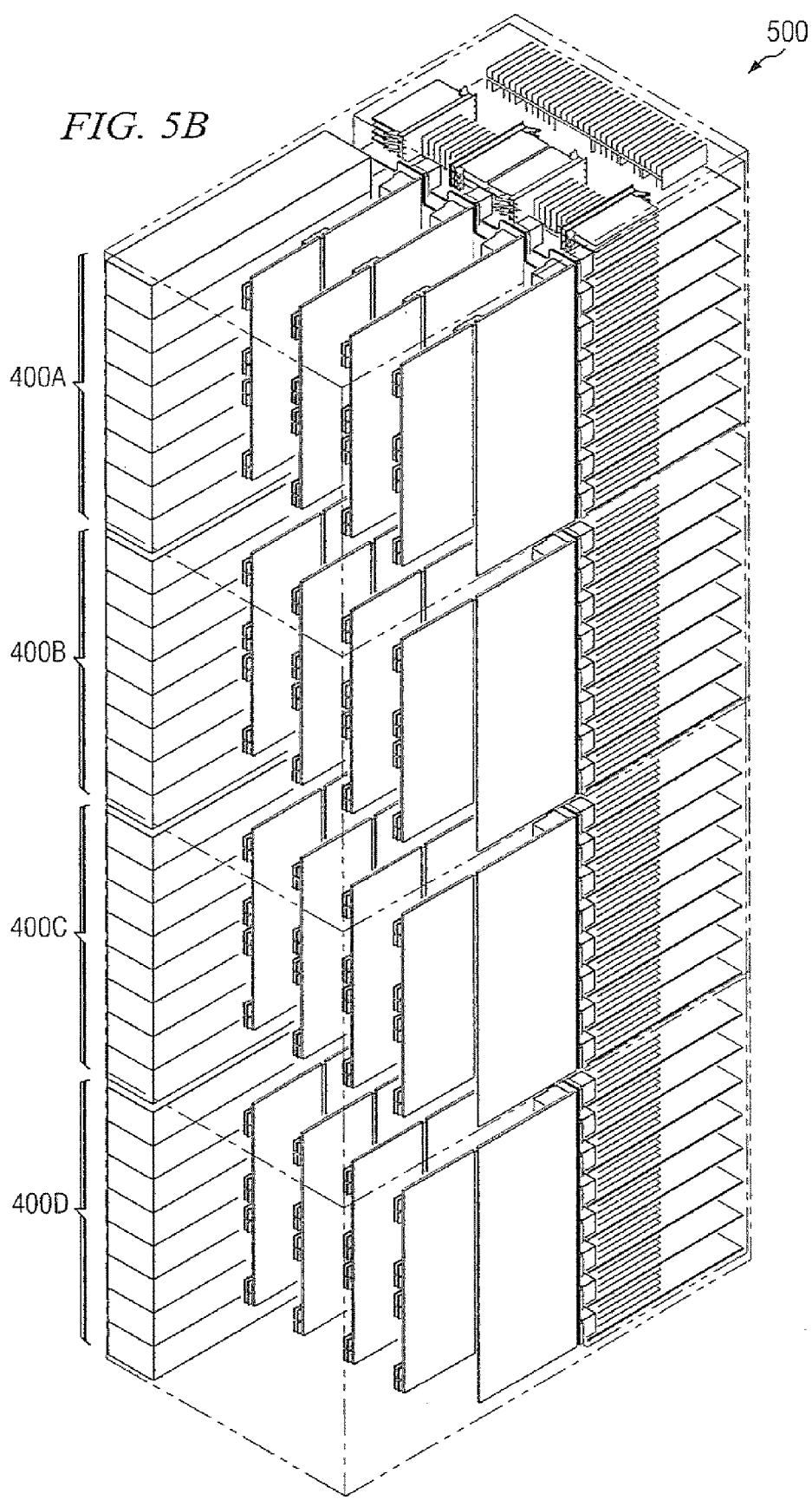

Additionally, the example architecture 400 of FIG. 4 is readily expandable. For instance, as shown in FIGS. 5A-5B, a plurality of the units may be interconnected (e.g., in a stacked arrangement) to form a larger overall system. FIGS. 5A-5B show an example in which 4 units of FIG. 4, shown as units 400A-400D, are interconnected to form cabinet 500 comprising a total of 32 cell boards. FIG. 5A shows an isometric view of the example arrangement from the front showing the front, right, and top sides thereof. FIG. 5B shows an isometric view of the example arrangement from the back showing the back, left, and top sides thereof. The units 400A-400D are interconnected, thus enabling all of the cell boards of system 500 to be communicatively interconnected.

More particularly, as described above, the interconnection cards of FIG. 3A enable interconnection of a plurality of units within a cabinet (via connectors 303A-303F shown in FIG. 3A). FIG. 6 shows an example of a plurality of interconnection cards being interconnected (e.g., as in the example cabinet of FIG. 53). More specifically, interconnection card $301_1$ having switch card $351_1$ coupled thereto is implemented within a first unit 400A; interconnection card $301_2$ having switch card $351_2$ coupled thereto is implemented within a second unit 400B; interconnection card $301_3$ having switch card $351_3$ coupled thereto is implemented within a third unit 400C; and interconnection card $301_4$ having switch card $351_4$ coupled thereto is implemented within a fourth unit 400D. Each interconnection card is communicatively coupled to each of the other interconnection cards. For instance, in this example, fiber optic cables are used to couple the interconnection cards (of course, other coupling techniques, such as copper wires or flex connectors may be used in alternative configurations). For example, interconnection card $301_1$ has a fiber optic cable coupling from its connector 303D (see FIG. 3A) to connector 303D of interconnection card $301_2$; interconnection card $301_1$ has a fiber optic cable coupling from its connector 303E (see FIG. 3A) to connector 303E of interconnection card $301_3$; and interconnection card $301_1$ has a fiber optic cable coupling from its connector 303F (see FIG. 3A) to connector 303F of interconnection card $301_4$. The other interconnection cards are likewise coupled to each of the interconnection cards in a column of the cabinet's architecture in this example. The interconnection between cards $301_3$ and $301_4$ are shown enlarged in the inset portion of FIG. 6. Accordingly, vertical routing of information may be performed (under the management of switch cards 351) by an interconnected column of interconnection cards 301, and horizontal routing of information may be performed by a cell board itself.

Figure 7:
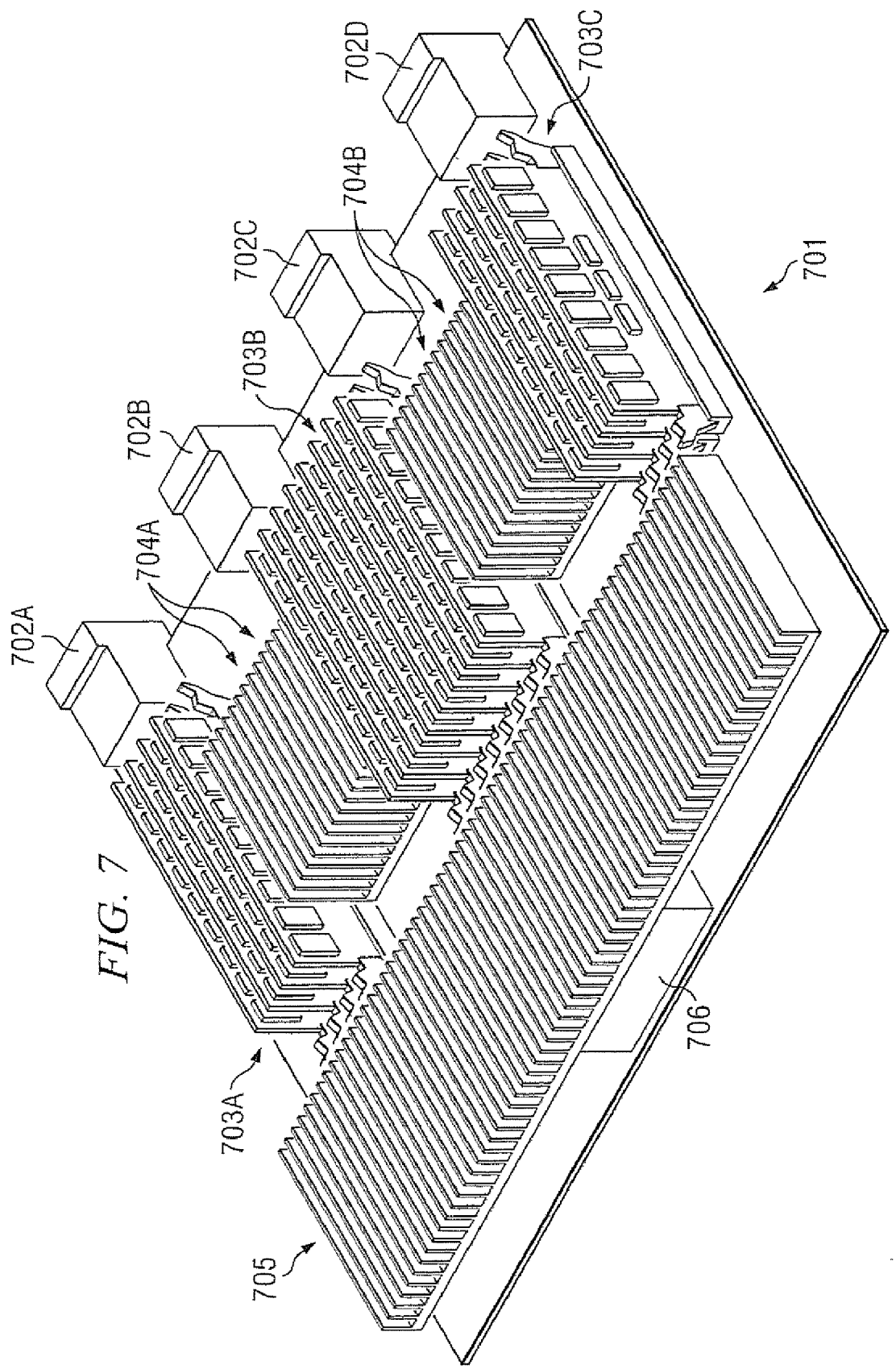
FIG. 7 shows an example configuration of a cell board that may be used in a second example embodiment of a cell board interconnection architecture.

Turning now to FIGS. 7-10C, another example embodiment of a 3D cell board interconnection architecture is shown. FIG. 7 shows an example cell board 701 that comprises components 703A, 703B, 703C, 704A, 704B, 705, and 706 implemented thereon, which correspond, for example, to components 203A, 203B, 203C, 204A, 204B, 205, and 206 of cell board 201 of FIG. 2A described above. As with FIG. 2A, the components of cell board 701 are arranged to enable optimal air flow in the front-to-back direction. Cell board 701 also comprises connectors 702A, 702B, 702C, and 702D for coupling to an interconnection structure as described further below. As opposed to the orthogonal connectors used in the example cell board configurations of FIGS. 2A-2B, connectors 702A-702D are connectors as are traditionally used for coupling to a backplane, such as the HMZD connector available from Tyco Electronics.

Figure 8A:
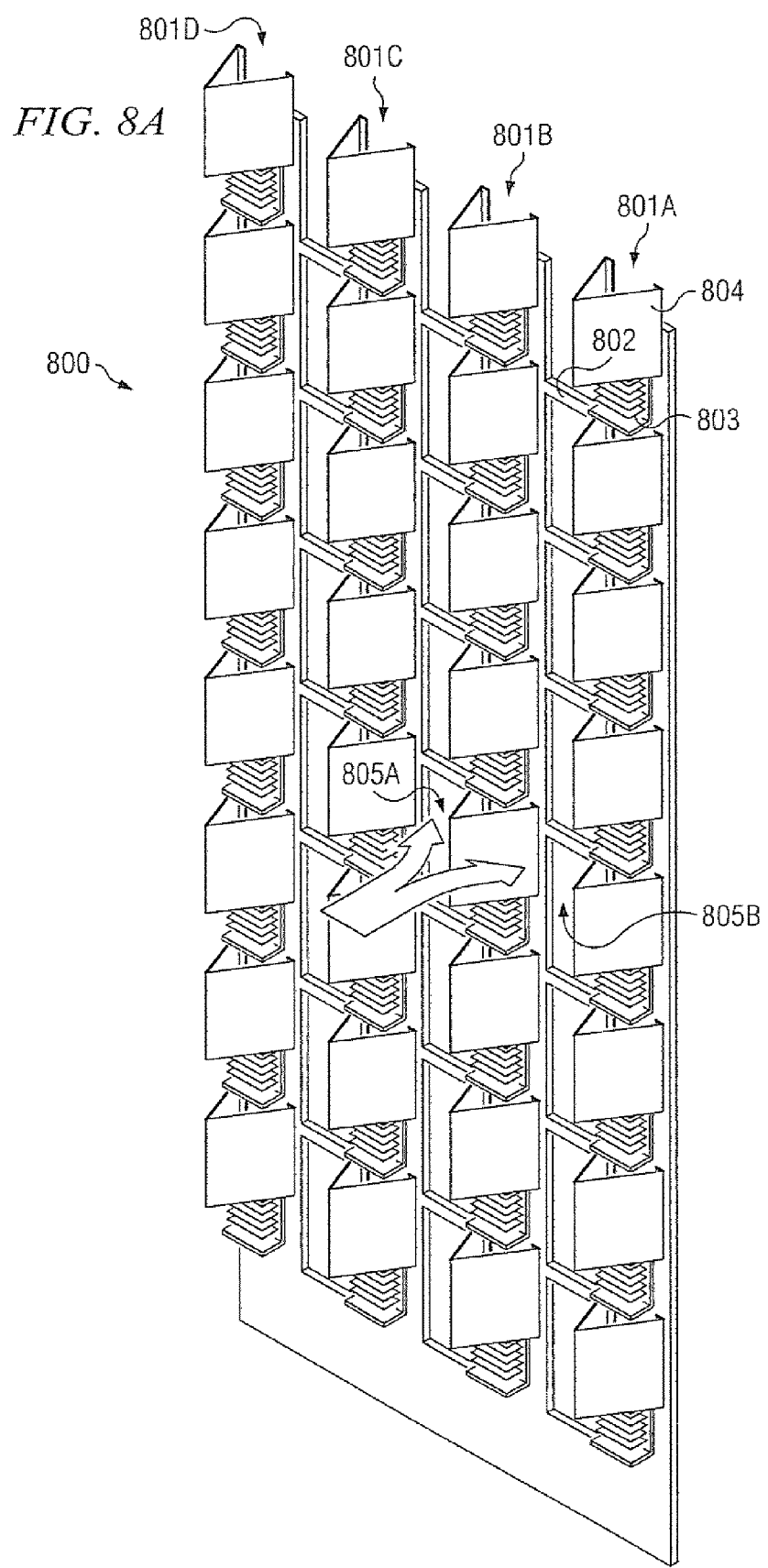

FIGS. 8A and 8B show an example interconnection structure 800 that may be utilized for interconnecting a plurality of cell boards, such as cell board 701 of FIG. 7. FIG. 8A shows the front side of structure 800 and FIG. 8B shows its back side. Example interconnection structure 800 effectively provides a porous backplane for interconnecting a plurality of cell boards, which allows for front-to-back air flow. In this example, interconnection structure 800 comprises vertical columns 801A, 801B, 801C, and 801D of connectors. The four columns 801A-801D are structurally coupled together in this example implementation via horizontal cross members, such as cross member 802, to form a matrix structure. Of course, in other implementations, the columns 801A-801D of connectors may be separate columns that are not structurally coupled together, and such columns may be arranged together to provide an interconnection structure in the manner described below.

As shown in FIG. 8A, the front-facing side of columns 801A-801D comprises connectors for coupling to cell boards, such as cell board 701 of FIG. 7. For instance, column 801A comprises eight connectors in this example, including connector 803 for coupling to a connector of a cell board. The back-facing side of columns 801A-801D (FIG. 8B) comprises connectors for coupling to switch cards, such as the switch card described below in FIG. 9. For instance, the back side of column 801A comprises four connectors in this example, including connector 806 for coupling to a connector of a switch card.

In this example implementation, interconnection structure 800 essentially provides an interface for cell boards and switch cards to be coupled thereto. That is, interconnection structure 800 passes information received from a connector to its front side to a connector on its back side (and vice-versa). For instance, interconnection structure 800 passes information between its connector 803 (which is coupled to a cell board connector) and connector 806 (which is coupled to a switch card connector, such as a connector of the switch card of FIG. 9 described below).

As shown in FIG. 5A, columns 801A-801D and the horizontal cross members connecting such columns are arranged to allow pores (or apertures) through which air may flow. For instance, apertures 805A and 805B are specifically labeled in FIG. 8A, and permit front-to-back airflow therethrough, as indicated by the arrows in FIG. 5A. In this example implementation, projections, such as projection 804, are included on each column to aid in reducing the resistance to the front-to-back air flow by directing the air to the apertures. This interconnection structure provides a reference plane to reduce tolerancing issues. This interconnection structure may be produced very inexpensively. Such interconnection structure 800 provides the 90 degree rotation in this example, rather than performing that rotation in an orthogonal connector (such as in the example cell board configurations of FIGS. 2A-2B).

Turning to FIG. 9, an example switch card 900 that may be utilized in this example embodiment is shown. Switch card 900 comprises connectors 901A, 901B, 901C, and 901D for coupling to the connectors on the back-side of a column of interconnection structure 800 described above, such as connector 806. Switch card 900 also comprises components 902A and 902B, which are ASICs or "cross-bar" chips (shown with heat sinks implemented thereon) for managing switching between the various cell boards coupled to interconnection structure 800. Thus, as with switch card 351 of FIG. 3B, switch card 900 controls the communication between the cell boards 701 coupled to interconnection structure 800. That is, switch card 900 arbitrates the routing of information between the cell boards. And, switch card 351 comprises cabinet-to-cabinet fabric connectors 903A-903L to enable a plurality of cabinets to be interconnected. In certain implementations, some of such connectors 903A-903L may be used for I/O connections. Further, switch card 900 includes connector(s) 904 for coupling such switch card 900 to another switch card within a cabinet, as shown below in the example of FIG. 10B. Thus, in this example embodiment, horizontal routing is performed by the cell boards 701 (i.e., routing from one component on a cell board 701 to another component on such cell board 701), and the vertical routing (i.e., routing from one cell board to another cell board) is performed by switch 900. Interconnection structure 800 provides a pass-through structure for interconnecting the cell boards 701 and the switch cards 900. Such interconnection structure 800 provides a reference plane for connecting the cell boards 701 and switch cards 900 to minimize tolerancing issues.

Figure 10A:
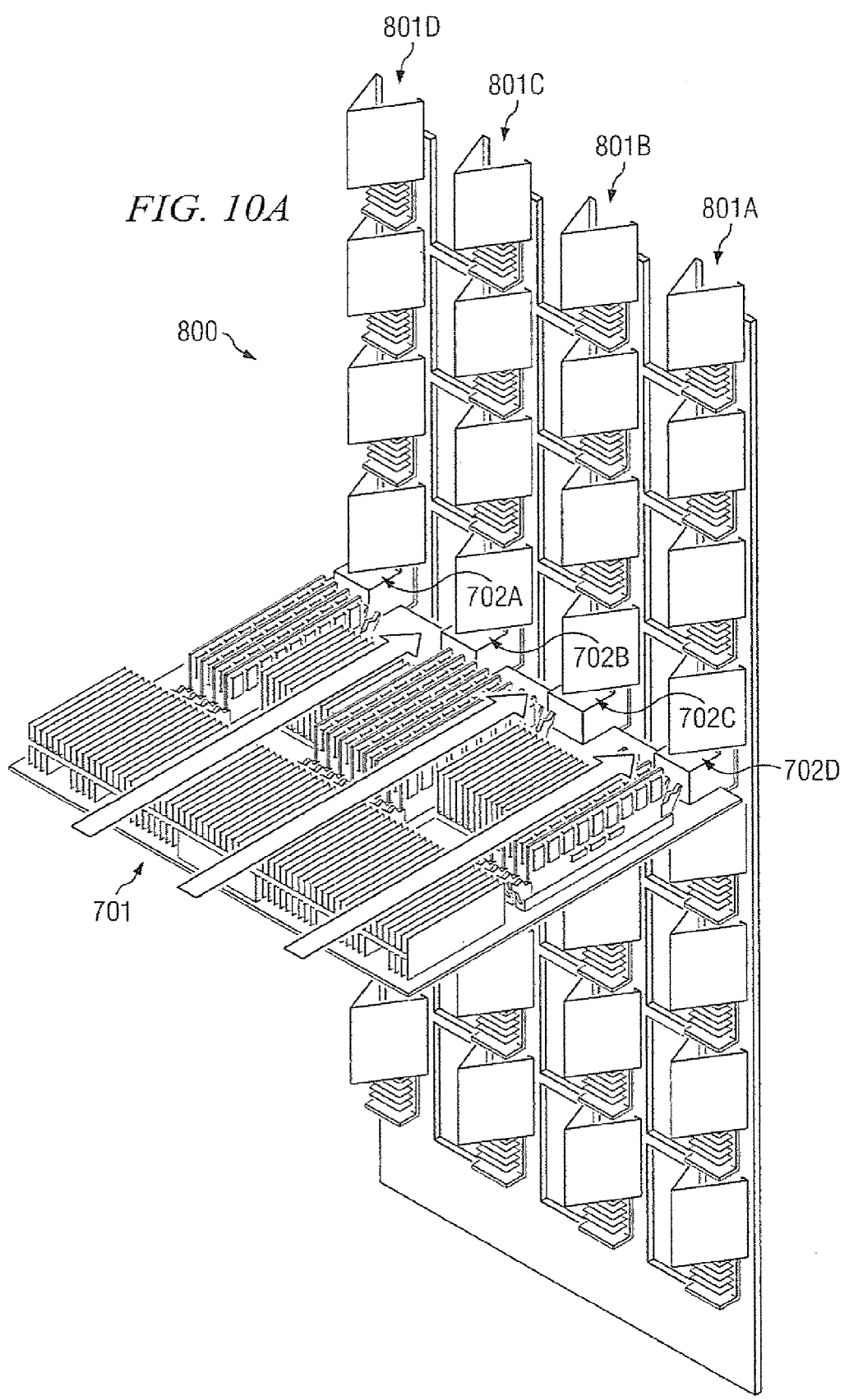
FIG. 10A shows a cell board of FIG. 7 coupled to the interconnection structure of FIGS. 8A-8B in accordance with the second example embodiment of a cell board interconnection architecture.

Turning now to FIG. 10A, an example of a cell board 701 (of FIG. 7) being coupled to interconnection structure 800 (of FIGS. 8A-8B) is shown. As show cell board 701 connects to a plurality of different columns 801A-801D of interconnection structure 800. More specifically, connector 702A of cell board 701 connects to a connector of column 801D; connector 702B of cell board 701 connects to a connector of column 801C; connector 702C of cell board 701 connects to a connector of column 801B; and connector 702D of cell board 701 connects to a connector of column 801A. As shown by the arrows in FIG. 10A, front-to-back air flow is permitted by this arrangement.

Figure 10B:
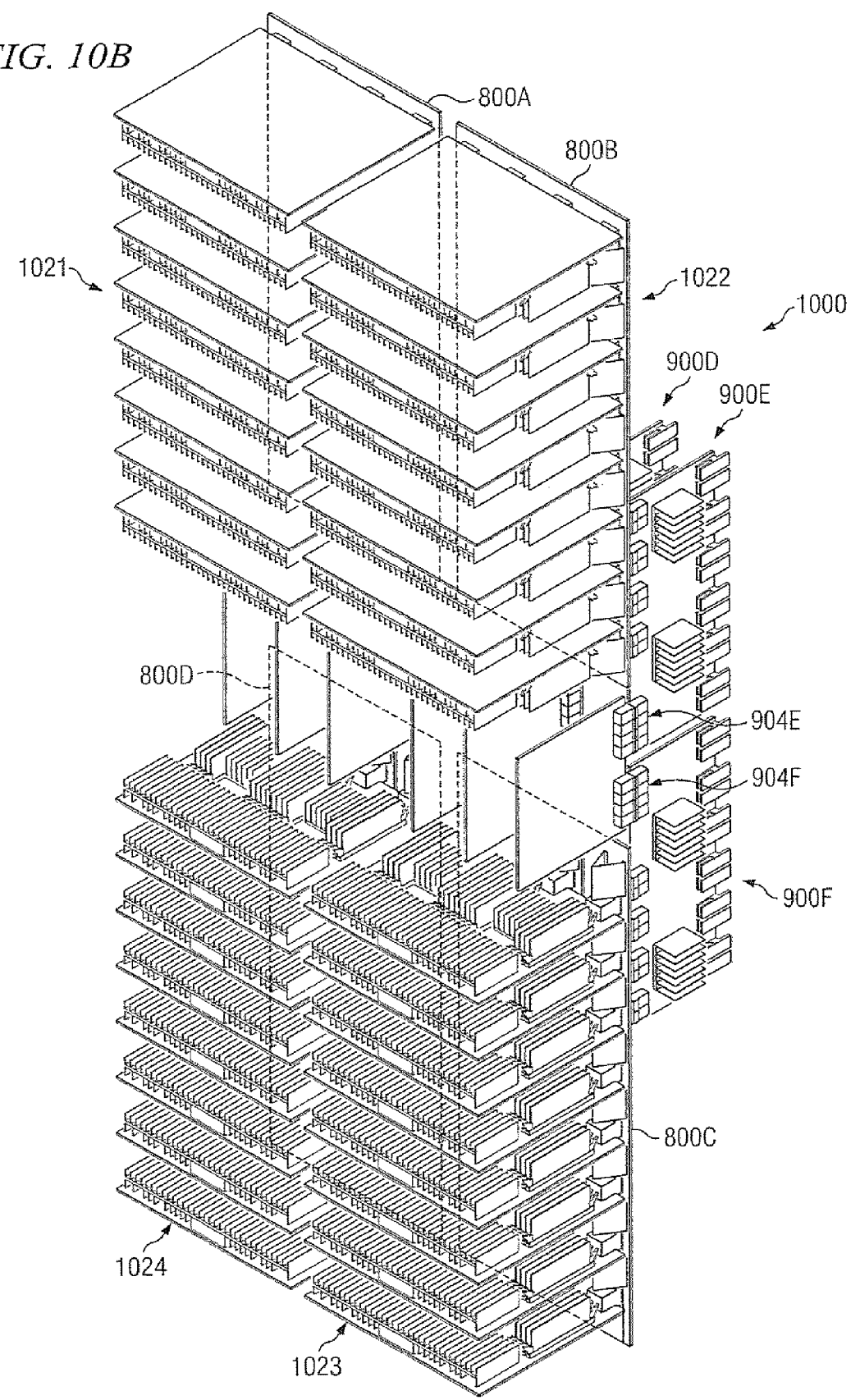
FIG. 10B shows an example unit that is formed by combining a plurality of the cell boards of FIG. 7 interconnected via a plurality of the interconnection structures of FIGS. 8A-8B and a plurality of the switch cards of FIG. 9 in accordance with the second example embodiment of a cell board interconnection architecture.

FIG. 10B shows an example unit 1000 that is formed by combining a plurality of the cell boards 701 of FIG. 7 interconnected via a plurality of the interconnection structures 800 of FIGS. 8A-8B and a plurality of the switch cards 900 of FIG. 9. In this example architecture 1000, a plurality of interconnection structures of FIGS. 8A-8B are implemented, shown as interconnection structures 800A, 800B, 800C, and 800D (not clearly seen in FIG. 10B).

Figure 10C:
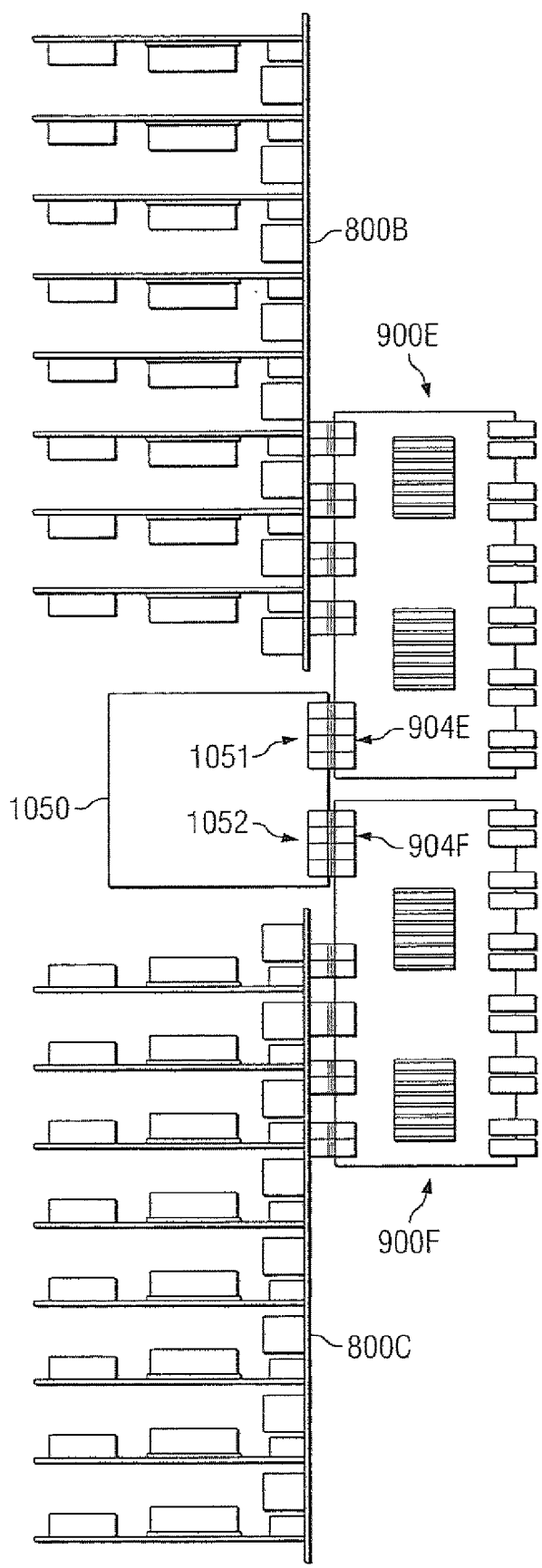
FIG. 10C shows the backside of the example unit of FIG. 10B.

FIG. 10C shows the backside of unit 1000 of FIG. 10B, which illustrates that connectors 904E of switch card 900E and connectors 904F of switch card 900F are coupled to connectors 1051 and 1052, respectively, of switch card connector card 1050. Such switch card connector card 1050 enables routing of information from switch card 900E to switch card 900F and vice-versa. Of course, rather than being implemented as a separate card, in certain implementations the connectors of switch card connector 1050 may be included on interconnection structure 800. That is, interconnection structure 800 may be implemented as including structures 800B and 800C, as well as switch card interconnector 1050 of FIG. 10C.

In this example, each of interconnection structures 800A-800D is capable of receiving eight (8) cell boards 701, thus enabling a total of 32 cell boards to be included in unit 1000. For instance, eight cell boards 701 labeled 1021 are coupled to interconnection structure 800A; eight cell boards 701 labeled 1022 are coupled to interconnection structure 800B; eight cell boards 701 labeled 1023 are coupled to interconnection structure 800C; and eight cell boards 701 labeled 1024 are coupled to interconnection structure 800D (not clearly shown in FIG. 10B). Coupled to the back-side of the interconnection structures are switch cards of FIG. 9, such as switch cards 900A, 900B, d 900C (additional switch cards may be coupled to the back-side of the interconnection structures, but cannot be clearly seen in FIG. 10B).

Also, in various implementations, a coupling between cell boards 1021 and 1022 may be provided either with cables that interconnect the switch cards 900 or with one monolithic panel across the top, or with flex connectors between interconnection structures 800A and 800B, as examples. Alternatively, interconnection structures 800A and 800B may be combined as a single interconnect structure, or interconnection structures 800A-800D may all be combined into a single interconnect structure in certain embodiments.

Figure 10D:
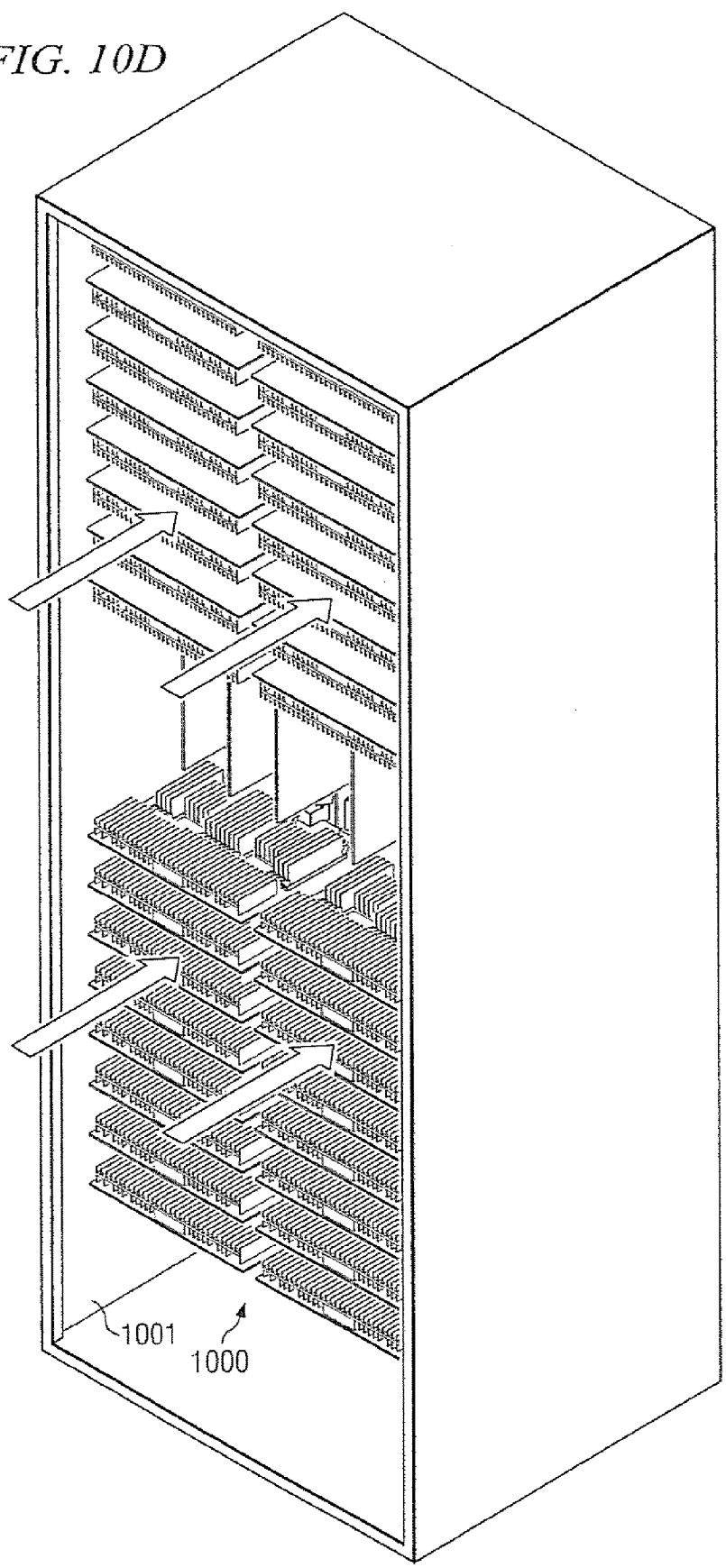
FIG. 10D shows the example unit of FIG. 10B arranged within a cabinet.

FIG. 10D shows the unit 100 of FIG. 10B arranged in a cabinet 1001. It should be recognized that this architecture allows for the cell boards to be accessed from the front of cabinet 1001; while permitting front-to-back air flow (as shown by the arrows). Thus, a plurality of such cabinets 1001 may be arranged side-by-side without the exhaust from one cabinet being ingested by another cabinet (because the air can flow front-to-back in each cabinet). It should also be understood that a plurality of units 1000 may be coupled together within a cabinet, e.g., in a stacked arrangement, such as in FIGS. 5A-5B of the previous embodiment.

Figure 11:
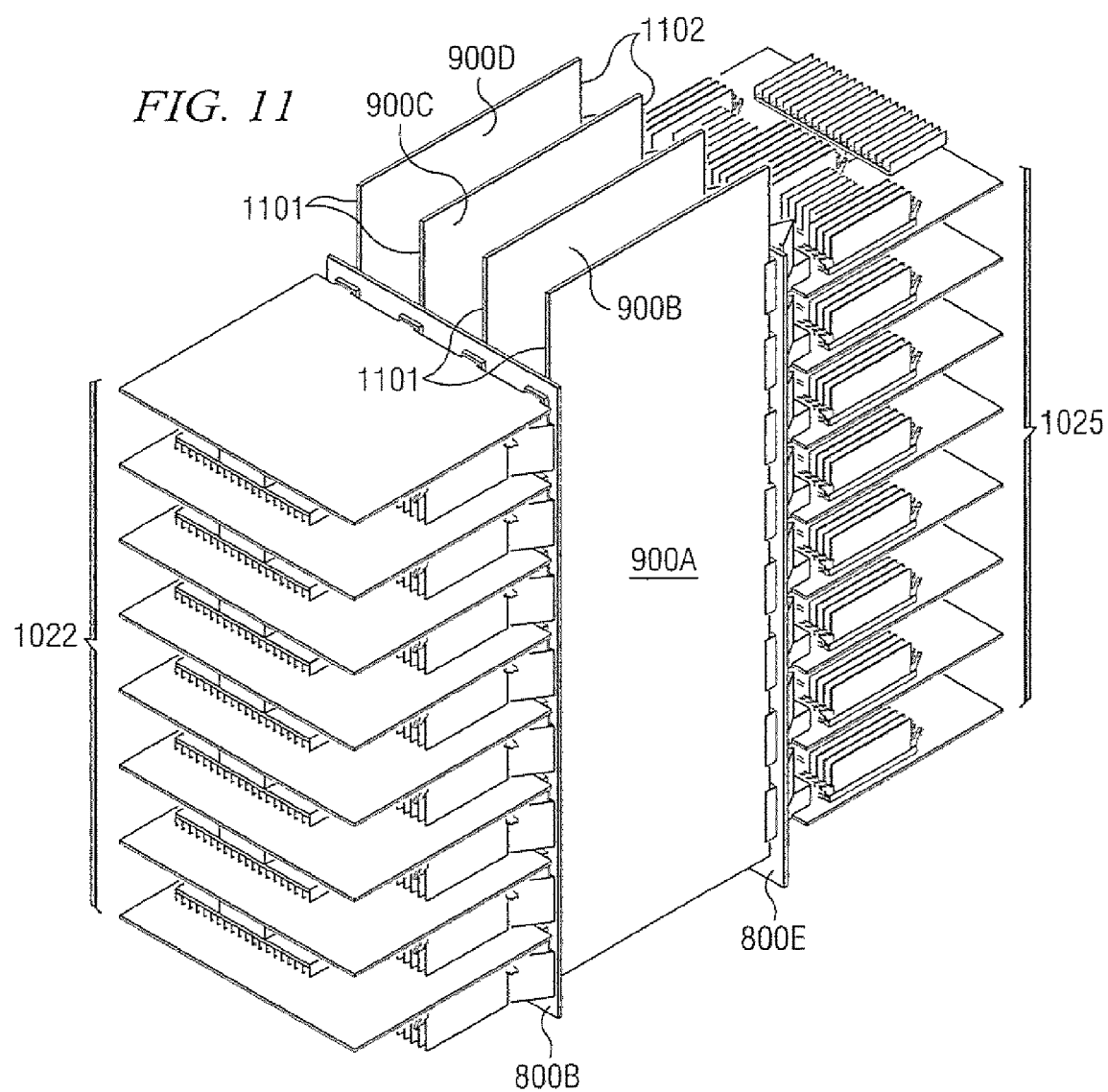
FIG. 11 shows a third example embodiment of a cell board interconnection architecture in which a first set of cell boards are coupled to a first interconnection structure (of FIGS. 8A-8B) that is coupled to a first side of switch cards (of FIG. 9) and a second set of cell boards are coupled to a second interconnection structure (of FIGS. 8A-8B) that is coupled to an opposite side of the switch cards.

FIG. 11 shows an example embodiment in which cell boards are arranged on opposing sides of an interconnection structure. More specifically, this example implementation shows cell boards 1022 that are coupled to interconnection structure 800B in the manner shown above in FIG. 10B. Further, switch cards 900A-900D are coupled to the backside of such interconnection structure 800B, as described above. In this example, a second interconnection structure 800E is coupled to switch cards 900A-900D on a side opposite the first interconnection structure 800B, and cell boards 1025 are coupled to such second interconnection structure 800E.

Switch cards 900A-900D are all redundant, but serviceability of the switch cards may be more difficult in this architecture. Thus, in certain implementations, switch cards 900A-900D may be implemented as passive cards and the cross-bar ASICs (if desired) may be included on the cell boards. In certain implementations, cards 900A-900D may be implemented as a simple interface and the routing logic may be implemented on switch cards that are coupled to such cards 900A-900D (e.g., such switch cards may be coupled to the raised edges 1101 and/or 1102 of cards 900A-900D). The arrangement of FIG. 11 enables front-to-back air flow, while allowing cell boards 1022 to be accessed from the front of the architecture and allowing cell boards 1025 to be accessed from the back of the architecture.

Figure 12A:
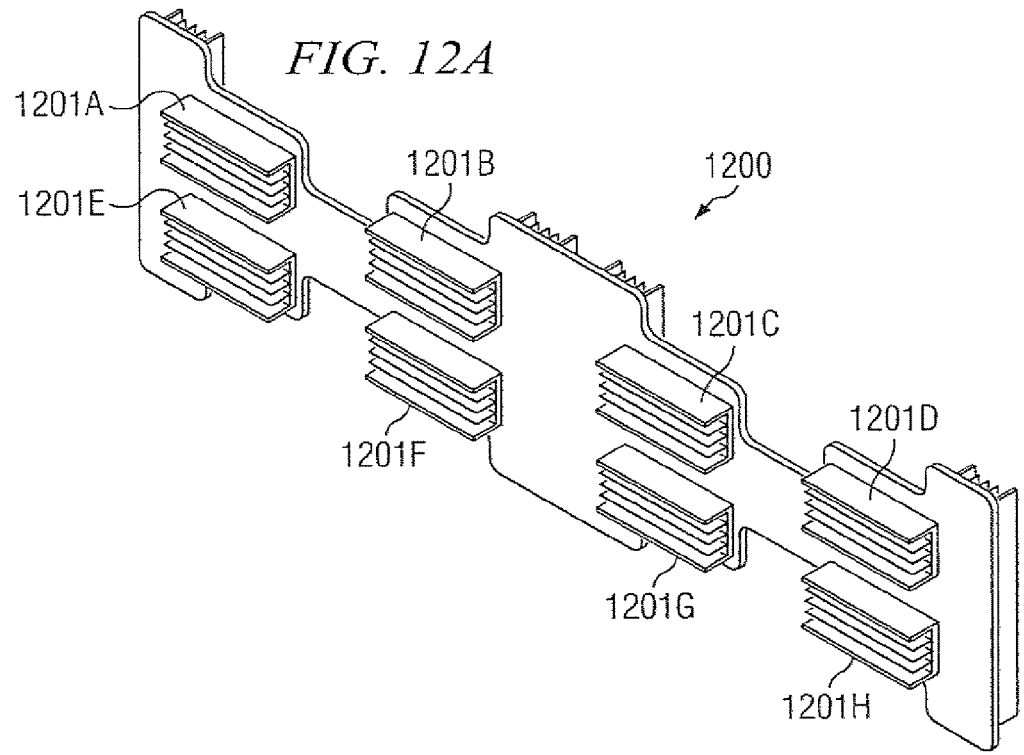
FIGS. 12A-12B show an example implementation of an interconnection structure that may be used in a fourth example embodiment of a cell board interconnection architecture.

Turning now to FIGS. 12A-16, another example embodiment of a 3D cell board interconnection architecture is shown. FIGS. 12A-12B show an example interconnection structure 1200 (e.g., a partial backplane structure). FIG. 12A shows the front side of interconnection structure 1200, and FIG. 12B shows the back side thereof. As shown in FIG. 12A, this example implementation of interconnection structure 1200 comprises connectors 1201A-1201H arranged on its font side for receiving cell boards coupled thereto, as described further below. As shown in FIG. 12B, interconnection structure 1200 comprises connectors 1202A-1202D arranged on its back side for receiving switch cards coupled thereto, as also described further below.

Figure 12B:
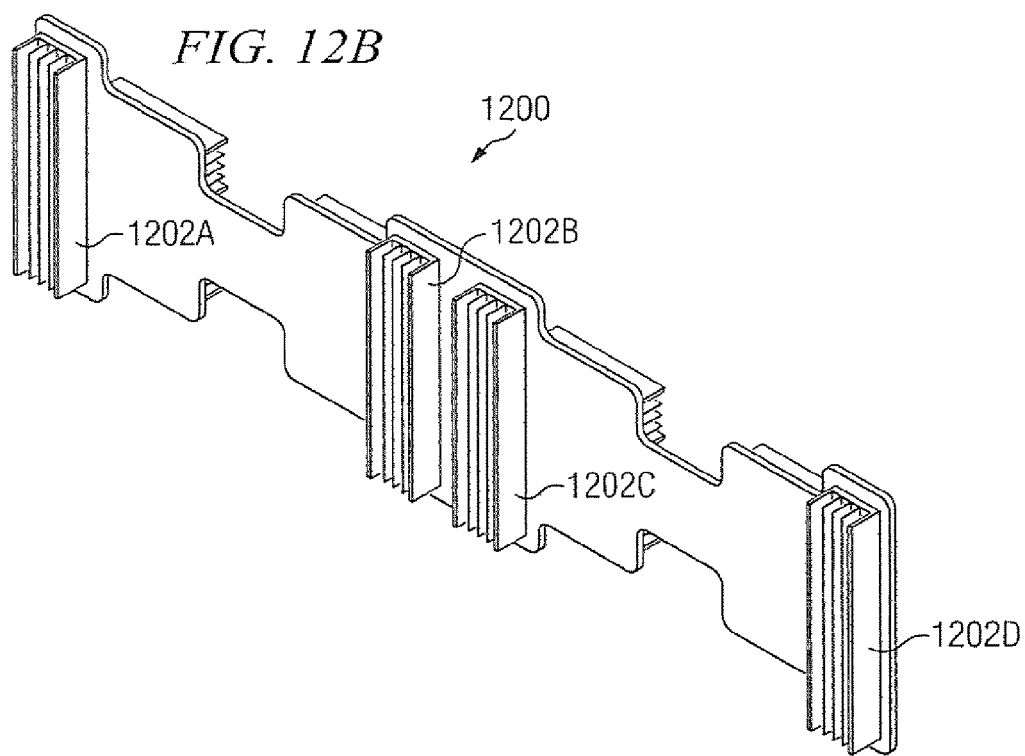
Figure 13:
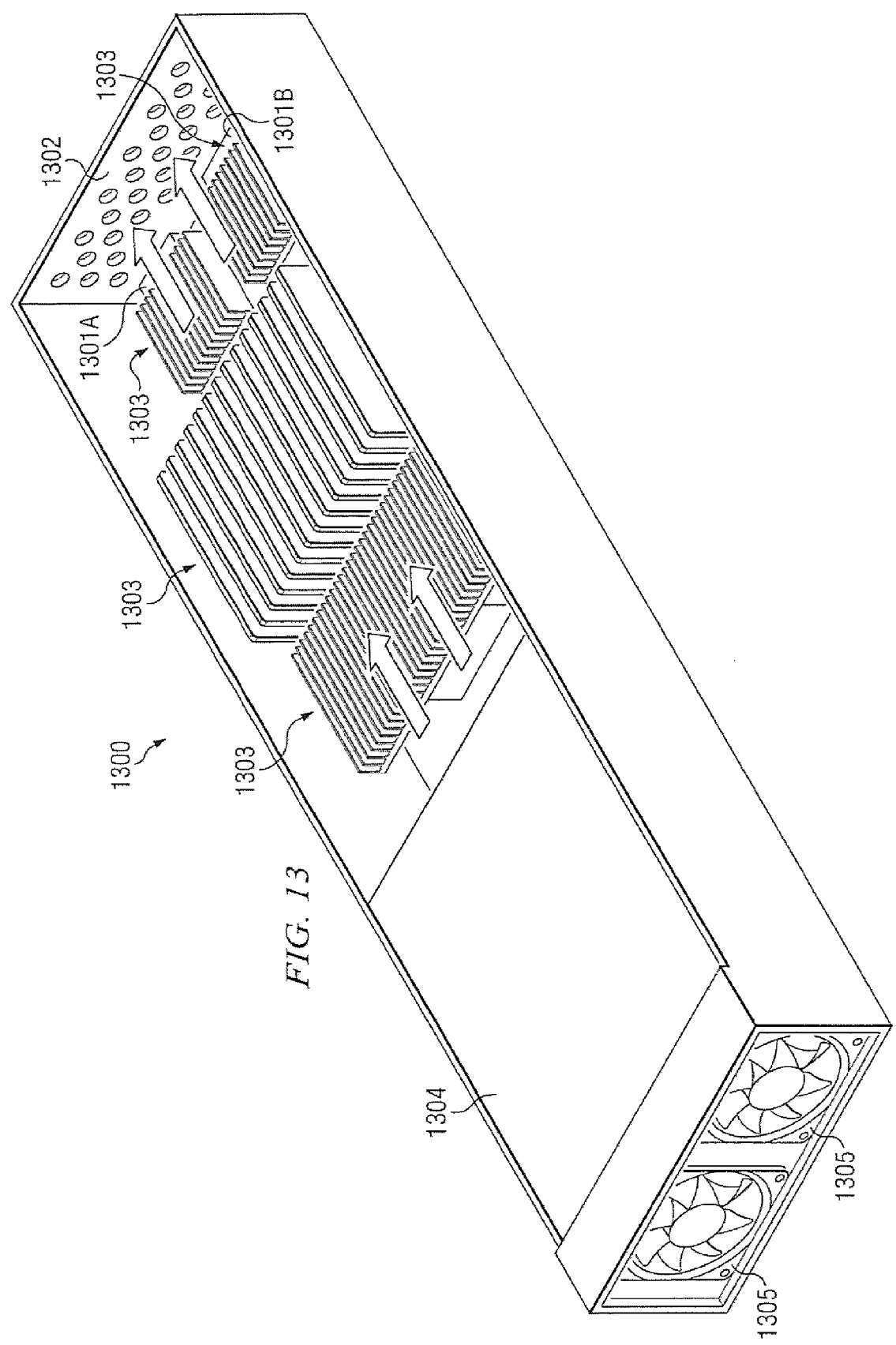
FIG. 13 shows an example configuration of a cell board that may be used in the fourth example embodiment of a cell board interconnection architecture.

FIG. 13 shows an example implementation of a cell board 1300 that may be coupled to interconnection structure 1200 of FIGS. 12A-12B, This example implementation of cell board 1300 comprises connectors 1301A and 1301B for coupling with connectors on the front-side of interconnection structure 1200. For example, connector 1301A may couple to connector 1201A of interconnection structure 1200, and connector 1301B may couple to connector 1201B of interconnection structure 1200. Cell board 1300 comprises components 1303, which may comprise components such as components 203A, 203B, 203C, 204A, 204B, 205, and 206 of cell board 201 of FIG. 2A described above, for example. As with the example cell board implementations of FIGS. 2A, 2B, and 7, the components of cell board 1300 are arranged to enable optimal air flow in the front-to-back direction. Cell board 1300 also comprises power supplies (AC to DC power converters) 1304 and cooling fans 1305, which may generate a flow of air from front-to-back, as indicated by the arrows. In this example implementation, cell board 1300 comprises porous back-cover 1302 arranged around connectors 1301A and 1301B wherein such porous back-cover 1302 permits the front-to-back air flow to exit therethrough.

Turning to FIGS. 14A-14C, an example unit 1400 is shown. FIG. 14A shows an isometric view of architecture 1400 from the font thereof, showing its front, top, and right sides. FIG. 14B shows an isometric view of architecture 1400 from the back thereof, showing its back, top, and left sides. FIG. 14C shows a planar view of architecture 1400 from its back, without the back-covers of the cell boards (shown as back-covers 1302A-1302D in FIG. 14B) being included.

In this example architecture 1400, a plurality of cell boards 1300 of FIG. 13 are implemented, shown as cell boards 1300A-1300D (see FIG. 14A). As shown in FIG. 14B, each cell board is coupled to interconnection structure 1200. For instance, with reference to FIGS. 12A and 14A, cell board 1300A is coupled to connectors 1201A and 1201B; cell board 1300B is coupled to connectors 1201C and 1201D; cell board 1300C is coupled to connectors 1201E and 1201F; and cell board 1300D is coupled to connectors 1201G and 1201H. As shown in FIG. 14B, each cell board comprises a porous back-cover that permits the front-to-back air flow to exit therethrough. More specifically, cell board 1300A comprises porous back-cover 1302A; cell board 1300B comprises porous back-cover 1302B; cell board 1300C comprises porous back-cover 1302C; and cell board 1300D comprises porous back-cover 1302D.

As shown more clearly in FIG. 14C, wherein the architecture is shown without the back-covers on the cell boards, the upper cell boards 1300A and 1300B are arranged upright, and the lower cell boards 1300C and 1300D have an opposite orientation when connected to interconnection structure 1200, in this example implementation. In this manner, the upper cell boards 1300A and 1300B are arranged such that their respective components 1303A and 1303B protrude upward from the cell board, and the lower cell boards 1300C and 1300D are arranged such that their respective components 1303C and 1303D protrude downward from the cell board. This arrangement aids in minimizing the resistance to the front-to-back air flow presented by the components.

Figure 15:
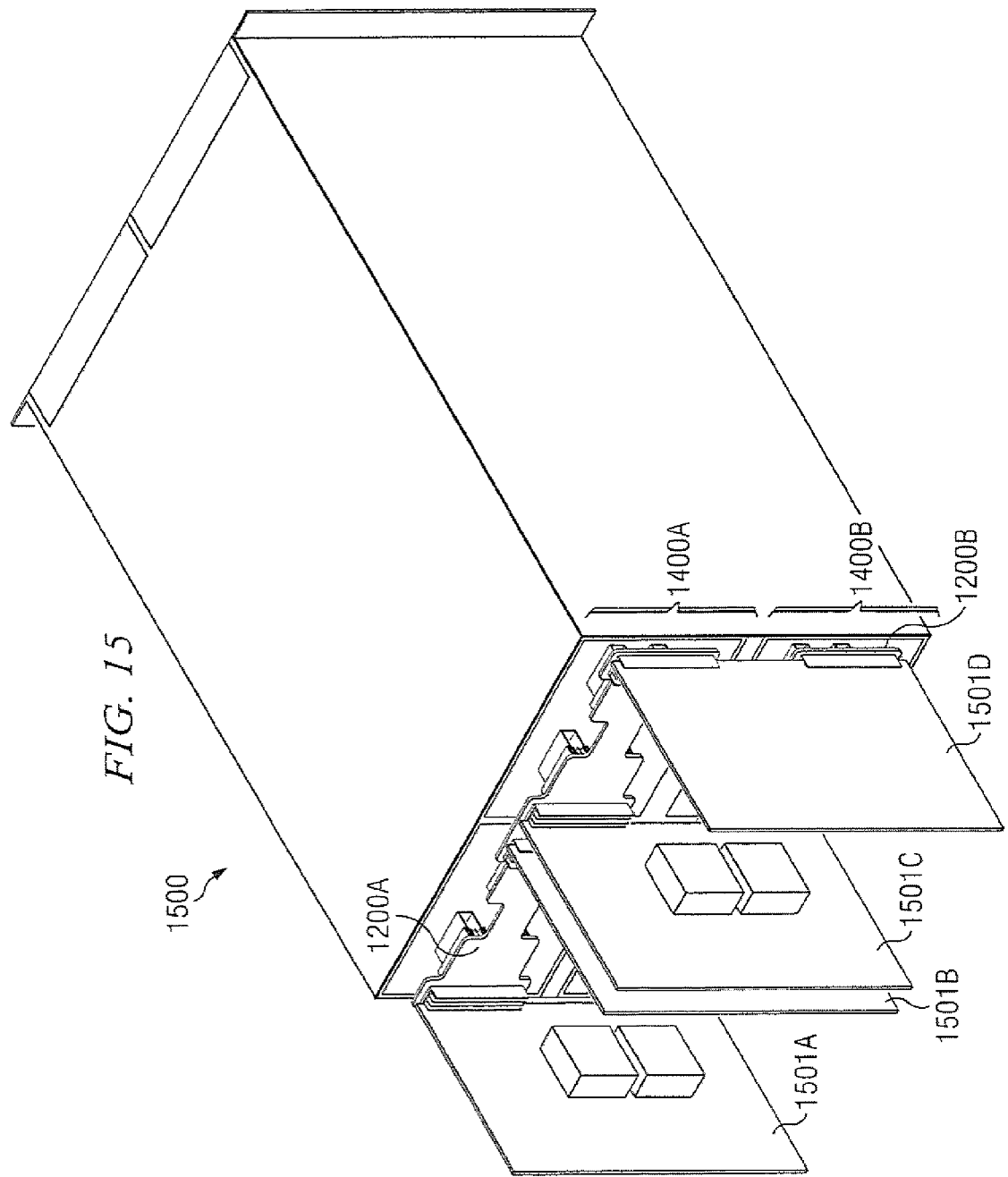
FIG. 15 shows an example unit that is formed by interconnecting a plurality of the units of FIGS. 14A-14C via switch cards in accordance with the fourth example embodiment of a cell board interconnection architecture.
Figure 16:
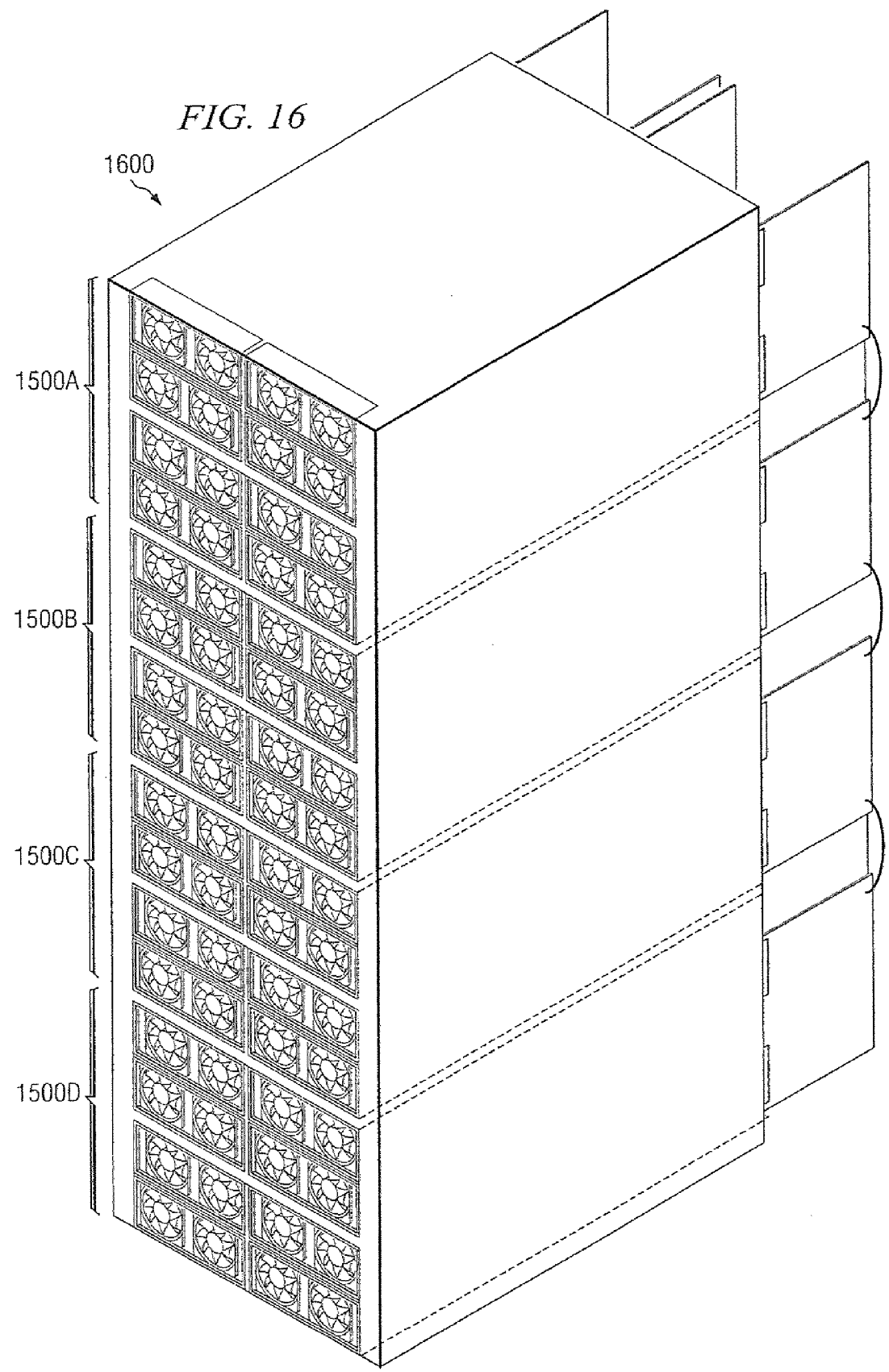
FIG. 16 shows an example cabinet that is formed by interconnecting a plurality of the units of FIG. 15 in accordance with the fourth example embodiment of a cell board interconnection architecture.

The example architecture 1400 of FIGS. 14A-14C is readily expandable. For instance, as shown in FIG. 15-16, a plurality of the units may be interconnected (e.g., in a stacked arrangement) to form a larger overall system. FIG. 15 shows an example in which two units of FIGS. 14A-14C, labeled 1400A and 1400B, are interconnected to form a larger unit 1500 comprising a total of 8 cell boards. FIG. 15 shows an isometric view of the example arrangement from the back, showing its back, top, and left sides. As shown, two interconnection structures of FIGS. 12A-12B are included, shown as interconnection structures 1200A and 1200B. Four cell boards comprising group 1400A are connected to interconnection structure 1200A, and four cell boards comprising group 1400B are connected to interconnection structure 1200B.

Also included in unit 1500 are switch cards 1501A-1501D. In this example implementation, horizontal routing (e.g., between any of connectors 1201A-1201) of interconnection structure 1200 is performed by interconnection structure 1200. Vertical routing (e.g., routing between a cell board coupled to interconnection structure 1200A and a cell board coupled to interconnection structure 1200B of FIG. 15), on the other hand, is performed by switch cards 1501A-1501D.

FIG. 16 shows an example in which 4 of the units 1500 of FIG. 15, shown as units 1500A-1500D, are interconnected to form cabinet 1600 comprising a total of 32 cell boards. FIG. 16 shows an isometric view of the example arrangement from the front, showing the cabinet's front, top, and right sides. The units 1500A-1500D are interconnected, thus enabling all of the cell boards of cabinet 1600 to be communicatively interconnected.

Figure 17:
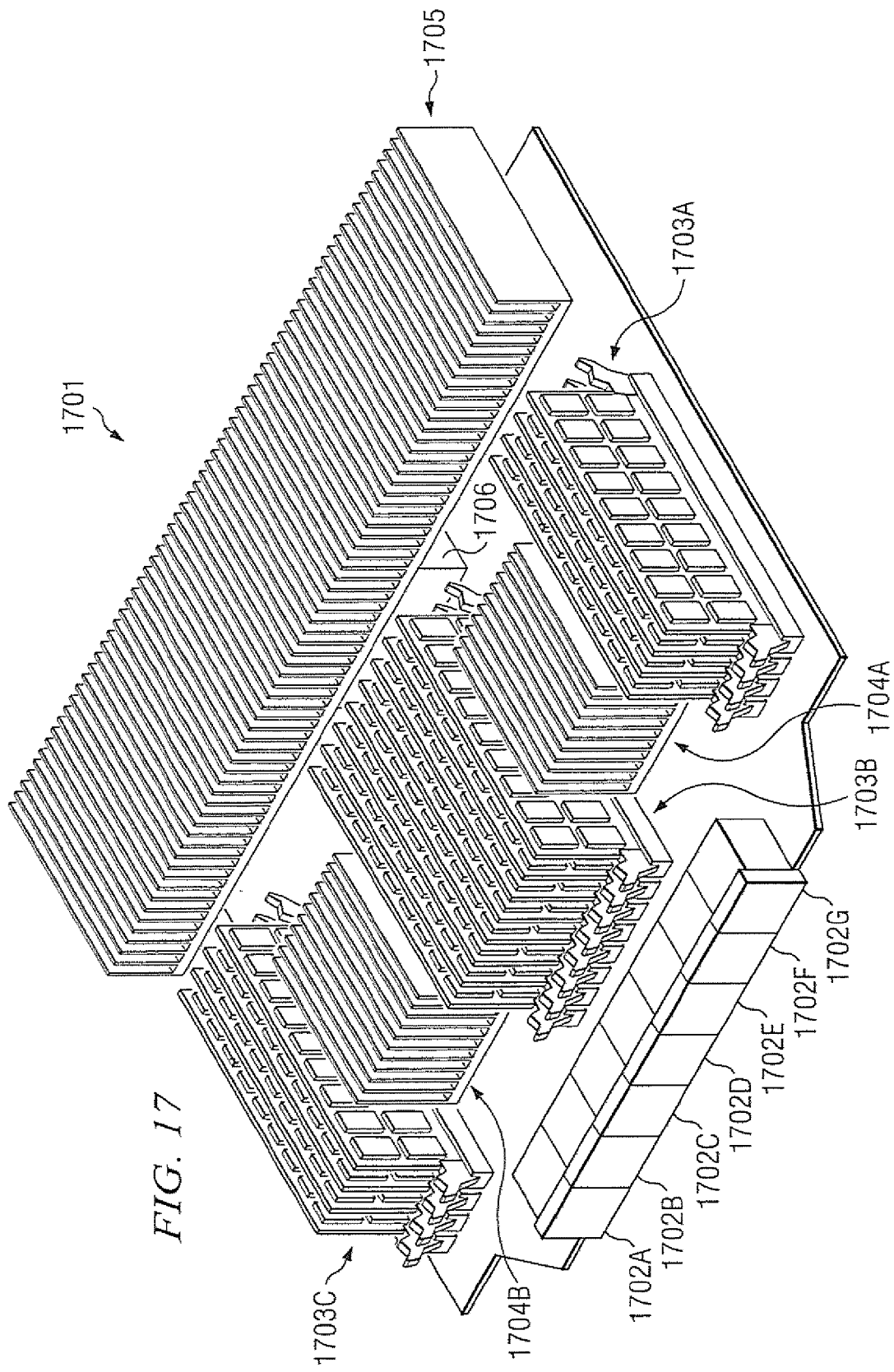
FIG. 17 shows an example configuration of a cell board that may be used in a fifth example embodiment of a cell board interconnection architecture.

FIGS. 17-20 show another example embodiment of a 3D cell board interconnection architecture. FIG. 17 shows an example cell board 1701 that comprises components 1703A, 1703B, 1703C, 1704A, 1704B, 1705, and 1706 implemented thereon, which correspond, for example, to components 703A, 703B, 703C, 704A, 704B, 705, and 706 of cell board 701 of FIG. 7 described above. As with FIG. 7, the components of cell board 1701 are arranged to enable optimal air flow in the front-to-back direction. Cell board 1701 also comprises connectors 1702A-1702G for coupling to an interconnection structure as described further below. As with the connectors of FIG. 7, connectors 1702A-1702G are connectors as are traditionally used for coupling to a backplane, such as the HMZD connector available from Tyco Electronics.

Figure 18A:
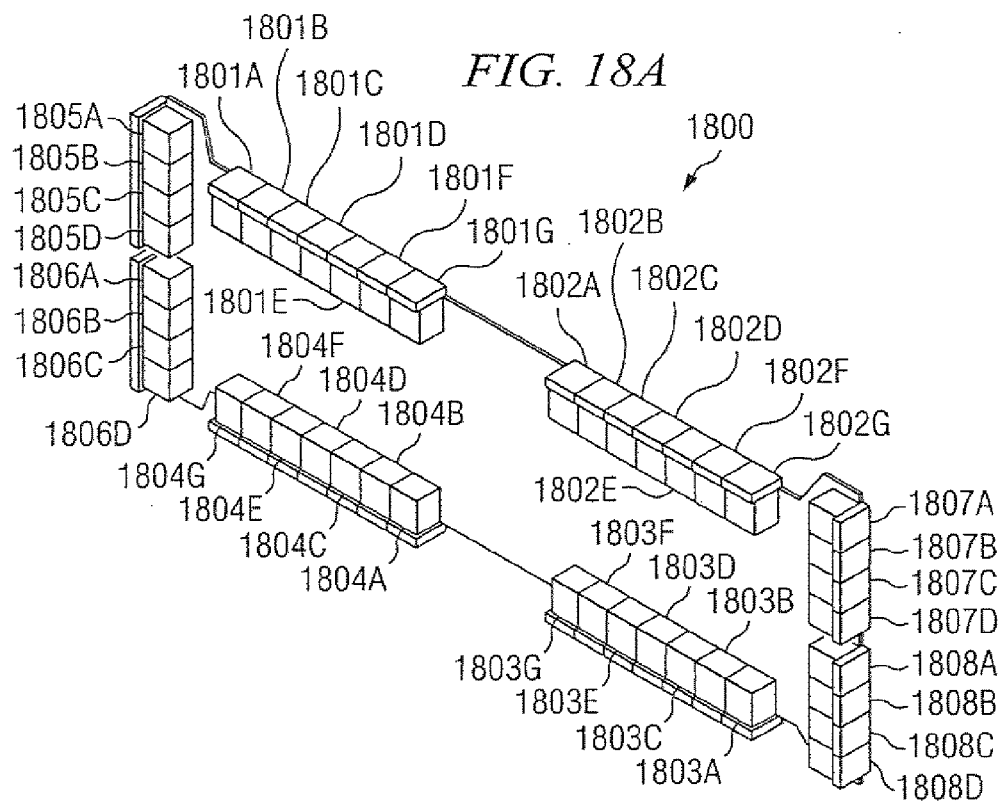
FIGS. 18A-18B show an example implementation of an interconnection structure that may be used in the fifth example embodiment of a cell board interconnection architecture.
Figure 18B:
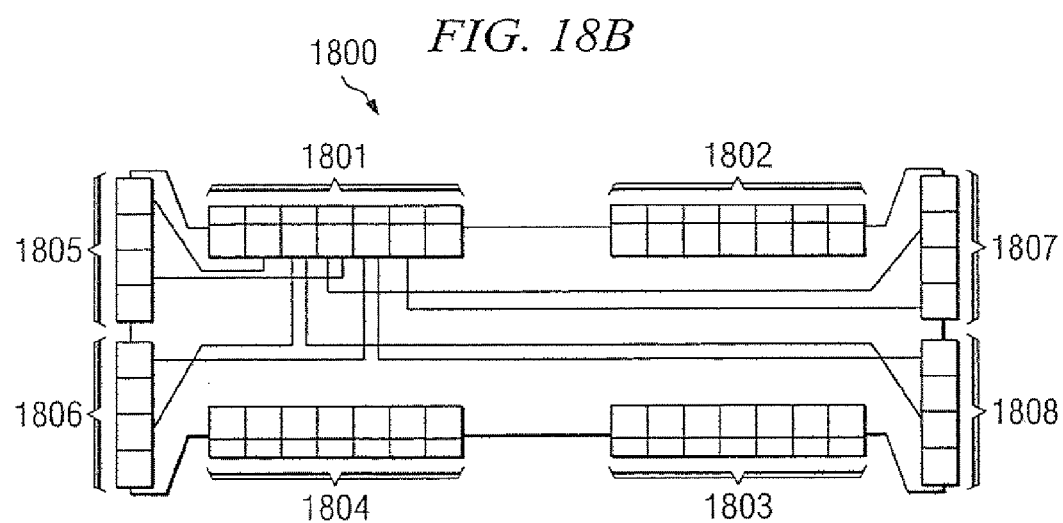

FIGS. 18A and 18B show an example interconnection structure 1800 that may be utilized for interconnecting a plurality of cell boards, such as cell board 1701 of FIG. 17. As shown in FIG. 18A, example interconnection structure 1800 includes edge connectors 1801A-1801G (referred to collectively as connectors 1801) for coupling to a cell board 1701. That is, edge connectors 1801A-1801G are complementary connectors for coupling with connectors 1702A-1702G of a first cell board 1701. Further, interconnection structure 1800 includes three additional sets of edge connectors, shown as connectors 1802A-1802G (referred to collectively as connectors 1802), 1803A-1803G (referred to collectively as connectors 1803), and 1804A-1804G (referred to collectively as connectors 1804), that are each for similarly receiving a cell board 1701. Accordingly, as discussed further below in connection with FIG. 20, a first cell board 1701 may be coupled to connectors 1801, a second cell board 1701 may be coupled to connectors 1802, a third cell board 1701 may be coupled to connectors 1803, and a fourth cell board 1701 may be coupled to connectors 1804, thereby resulting in a horizontal plane of interconnected cell boards.

Figure 19A:
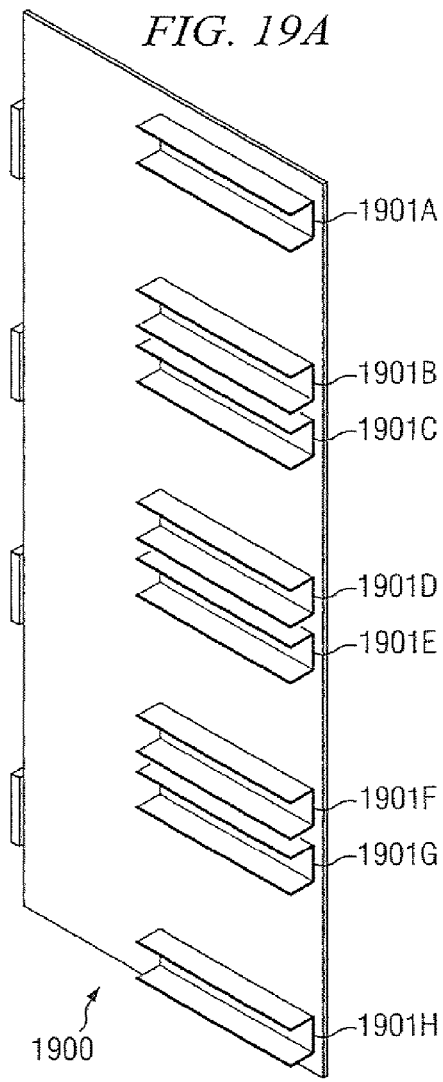
Figure 19B:
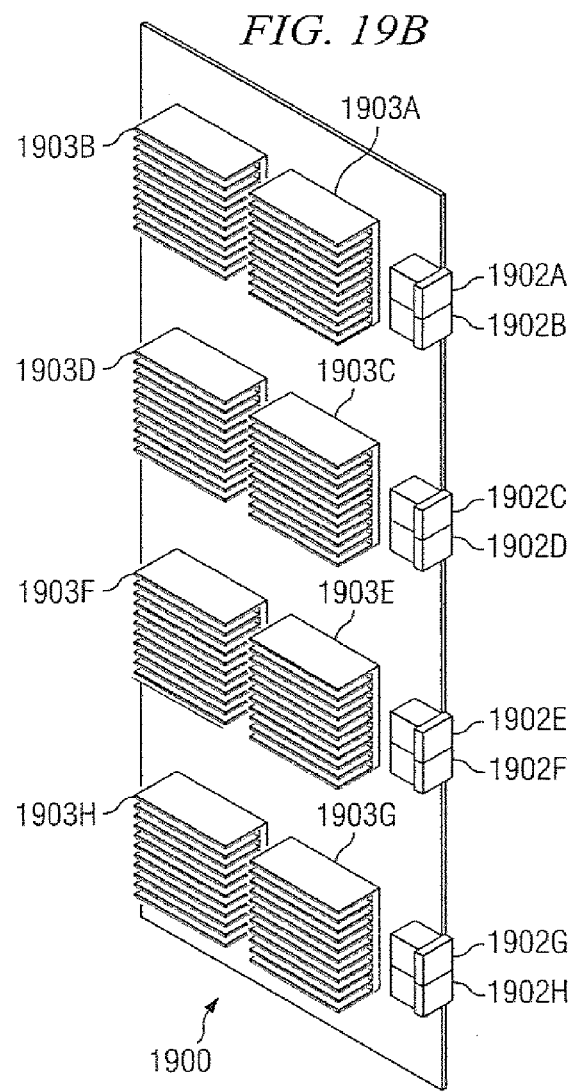

As further shown in FIG. 18A, interconnection structure 1800 includes edge connectors for coupling with switch cards, such as the switch card 1900 discussed hereafter in connection with FIGS. 19A-19C. More specifically, interconnection structure 1800 includes connectors 1805A-1805D for coupling with a first switch card, connectors 1806A-1806D for coupling to a second switch card, connectors 1807A-1807D for coupling to a third switch card, and connectors 1808A-1808D for coupling to a fourth switch card.

FIG. 18B shows an example of the routing provided by interconnection structure 1800. More specifically, FIG. 18B shows an example of the routing provided by structure 1800 for a first cell board 1701 that is coupled to structure 1800 via connectors 1801. As shown, structure 1800 is capable of routing data from a cell board 1701 to any one of the switch cards 1900 that are coupled to structure 1800. That is, interconnection structure 1800 is capable of routing data between a cell board coupled to connectors 1801 and any one of the switch-card interfaces (or connectors) 1805, 1806, 1807, and 1808.

Turning to FIGS. 19A-19C, an example switch card 1900 that may be utilized in this example embodiment is shown. FIG. 19A shows one side of switch card 1900 and FIG. 19B shows an opposite side of switch card 1900, while FIG. 19C shows an example of the routing provided by this example switch card 1900. As shown in FIG. 19A, switch card 1900 comprises connectors 1901A-19011H that are each capable of coupling to a set of switch-card connectors of interconnection structure 1800 described above, such as connectors 1805A-1805D. Thus, for example, switch-card connectors 1805A-1805D of structure 1800 (FIG. 18A) may be coupled to connector 1901A of switch card 1900.

As shown in FIG. 19B, switch card 1900 also comprises connectors 1902A-1902H, which are cabinet-to-cabinet fabric connectors, such as the connectors 903A-903L in the switch card 900 of FIG. 9 to enable a plurality of cabinets to be interconnected. Connectors 1902A-1902H may be implemented as copper wires or as optical cables, as examples. In certain implementations, some of such connectors 1902A-1902H may be used for I/O connections. Switch card 1900 also comprises components 1903A-19031H, which are ASICs or "cross-bar" chips (shown with heat sinks implemented thereon) for managing switching between the various cell boards 1701 coupled to interconnection structure(s) 1800 that are coupled to switch card 1900. Thus, as with switch card 900 of FIG. 9, switch card 1900 controls the communication between the cell boards 1701 coupled to interconnection structure 1800. That is, switch card 1900 arbitrates the routing of information between the cell boards 1701.

FIG. 19C shows an example of the routing provided by switch card 1900. More specifically, FIG. 19C shows an example of the routing provided by switch card 1900 for a first interconnection structure 1800 that is coupled to switch 1900 via connector 1901. In this example, connectors 1805A-1805D of interconnection structure 1800 (FIG. 18A) are coupled to connectors 1901A of switch card 1900. As shown, switch card 1900 is capable of routing data from a first interconnection structure 1800 to another interconnection structure 1800 that is coupled to switch card 1900. For instance, ASICs 1903A and 1903B are operable to route data from connectors 1805A-1805D of a first interconnection structure 1800 that are coupled to connectors 1901A to a second interconnection structure 1800 that is coupled to connectors 1901B of switch card 1900. Further, ASIC 1903A is capable of routing data to ASIC 1903C, 1903E, and 1903G, which are capable of routing such data to other interconnection structures 1800 that are coupled to connectors 1901C-1901H.

Thus, in this example embodiment, horizontal routing is performed by the cell boards 1701 (e.g., routing from one component on a cell board 1701 to another component on such cell board 1701), and the vertical routing (i.e., routing from one cell board to another cell board) is performed by switch 1900. Additionally, horizontal routing between different cell boards on a horizontal plane (e.g., a plane formed by multiple cell boards 1701 that are connected to a common interconnection structure 1800 is provided via such interconnection structure 1800, while routing between different horizontal planes is provided by switch card(s) 1900, as described further below in connection with FIG. 20.

While the horizontal routing between cell boards on a common horizontal plane (i.e., coupled to a common interconnection structure), such as between a first cell board 1701 coupled to connectors 1801 and a second cell board 1701 coupled to connectors 1802, is performed by interconnection structure 1800 in this example, in certain implementations this horizontal routing may be supported by switch card(s) 1900. For instance, in certain implementations, rather than interconnection structure 1800 providing routing between different cell boards coupled thereto, it may route all communication to a switch card 1900, which then routes the communication to the to the proper cell board (even if the cell boards are on a common horizontal plane). For example, interconnection structure 1800 may provide communication paths from each set of cell board connectors 1801-1804 to switch card connectors 1805-1808, such as shown in the example of FIG. 18B for connectors 1801. Suppose data is received (from a cell board 1701) at cell board connectors 1801 and is destined to another cell board connector of the same interconnection structure, such as connectors 1802; in an example implementation in which routing between different cell boards of a common horizontal plane is performed through the switch cards, the received data is routed from correctors 1801 to a switch card (e.g., via a switch card connector, such as connectors 1807, which in turn routes the data to cell board connectors 1802 via the communication path between the switch card connector (1807) and such cell board connectors 1802. Of course, in certain implementations communication paths between each of cell board connectors 1801-1804 may be included on interconnection structure 1800 such that interconnection structure 1800 is capable of routing data between any of the cell boards coupled thereto (e.g., between any cell boards of this horizontal plane) without requiring routing of the data to the switch cards.

Figure 20:
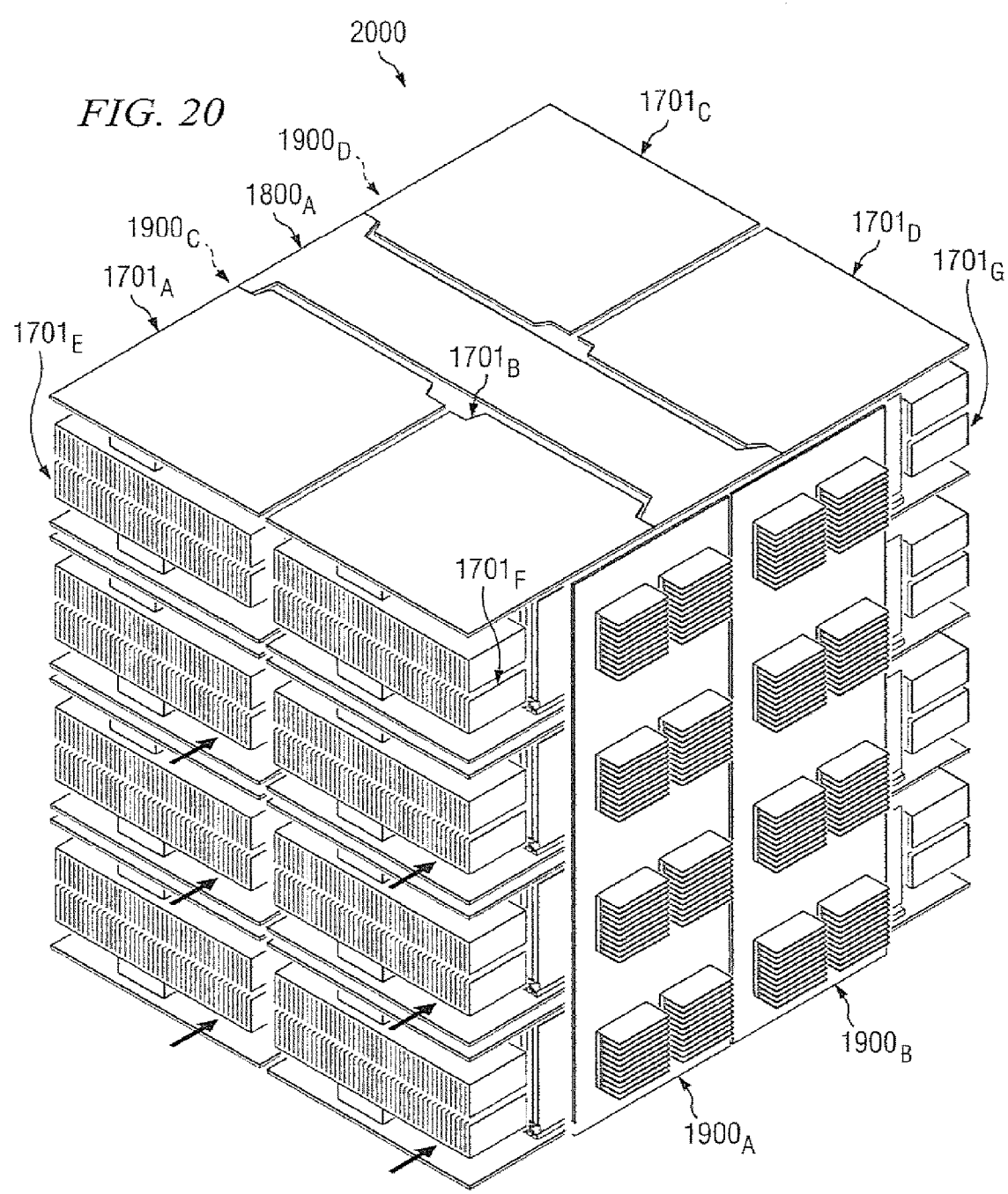
FIG. 20 shows an example unit that is formed by combining a plurality of the cell boards of FIG. 17 interconnected via a plurality of the interconnection structures of FIGS. 18A-18B and a plurality of the switch cards of FIGS. 19A-19C in accordance with the fifth example embodiment of a cell board interconnection architecture.

Turning now to FIG. 20, an example unit 2000 that is formed by combining a plurality of the cell boards 1701 of FIG. 17 interconnected via a plurality of the interconnection structures 1800 of FIGS. 18A-18B and a plurality of the switch cards 1900 of FIGS. 19A-19C is shown. In this example architecture 2000, eight (8) separate interconnection structures 1800 of FIGS. 18A-18B are implemented, a first of which labeled as $1800_A$ can be seen. Each of the interconnection structures 1800 are coupled to switch cards $1900_A$-$1900_D$ (wherein $1900_C$ and $1900_D$ are not seen in FIG. 20). Further, four cell boards are coupled to each of the interconnection structures 1800, each forming a horizontal plane of interconnected cell boards (for a total of eight horizontal planes in this example). For instance, cell boards $1701_A$-$1701_D$ are coupled to a first interconnection structure $1800_A$, forming a first horizontal plane of cell boards. Similarly, cell boards $1701_E$-$1701_G$ and another cell board (not seen in FIG. 20) are coupled to a second interconnection structure 1800 (not seen in FIG. 20), forming a second horizontal plane of cell boards. In total, this example unit 2000 provides interconnection of a 4 by 8 arrangement of cell boards, thus allowing interconnection of 32 cell boards 1701.

Of course, while interconnection structure 1800 in this example allows for up to 4 cell boards to be connected thereto, in other implementations such interconnection structure 1800 may be implemented to permit any number of cell boards to be coupled thereto. For instance, while this example implementation provides for two cell boards to be coupled to opposing sides of interconnection structure 1800, in other implementations a different number of cell boards (e.g., greater than or less than two) may be allowed for on the opposing sides of interconnection structure 1800. For example, in certain implementations, cell board connectors may be included on interconnection structure 1800 for coupling four cell boards thereto on each opposing side, thus allowing for a horizontal plane of eight (8) interconnected cell boards. Further, while the example unit 2000 of FIG. 20 has eight (8) horizontal planes of cell boards, in other implementations such a unit may be implemented to have any number of horizontal planes (and switch cards 1900 may be adapted to account for any such number of horizontal planes).

Further, as with the example embodiment of FIGS. 10A-10D, a plurality of such units 2000 may be communicatively interconnected (e.g., within a cabinet) via fabric connectors 1902A-1902H (FIG. 19B) of switch cards 1900. Alternatively, in certain embodiments, switch cards 1900 may be implemented to span a plurality of units 2000, and such switch cards 1900 thereby interconnect the plurality of units. For instance, a first switch card may be available for use in connecting up to eight horizontal planes of cell boards together, and a second, larger, switch card may be available for use in place of the first switch card to enable two units (e.g., 16 horizontal planes of cell boards) to be interconnected when so desired. Additionally, a plurality of cabinets may be communicatively interconnected with each other via fabric connectors 1902A-19022H. Thus, this provides a modular architecture that can be readily expanded to implement larger-scale systems as desired. Additionally, this example architecture also permits front-to-back air flow (as shown by the arrows in FIG. 20).

In the example interconnection architecture of FIG. 20, a plurality of horizontal planes of interconnected cell boards are provided, wherein each horizontal plane includes a plurality of cell boards interconnected via an interconnection structure 1800. Each interconnection structure 1800 supports the horizontal routing within its respective horizontal plane (e.g., routing along axes X and Z of FIG. 1) to enable cell boards within a common horizontal plane to communicate with each other. Additionally, a plurality of different interconnection structures are coupled to one or more switch cards 1900 (e.g., switch cards $1900_A$-$1900_D$ in the example of FIG. 20). The switch cards 1900 span a plurality of different horizontal planes, thereby communicatively interconnecting different horizontal planes. That is, switch cards 1900 provide the vertical routing (along axis Y of FIG. 1) for the architecture.

Figure 21A:
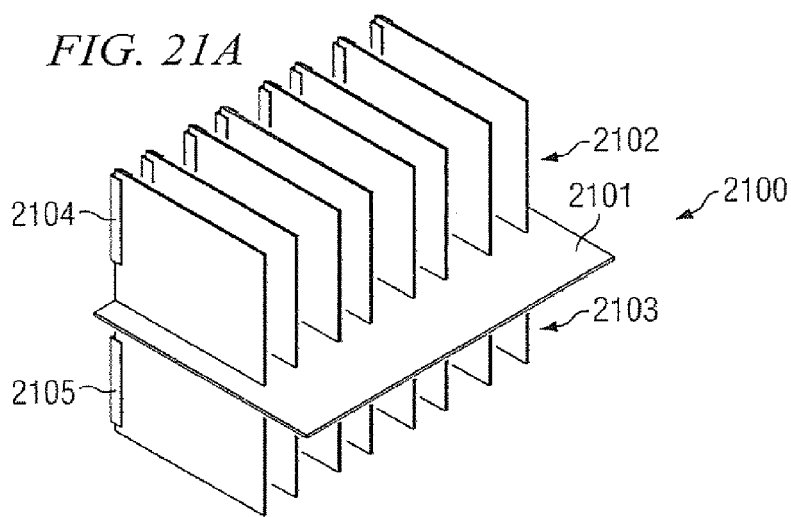
FIG. 21A shows an example 3D interconnection architecture in accordance with certain embodiments.

FIGS. 21A-26 provide various other example 3D interconnection architectures that may be implemented for interconnecting cell boards for forming a desired computer system. FIG. 21A shows an example 3D interconnection structure 2100 that includes switch board 2101 to which a plurality of cell board interconnect structures 2102 and 2103 are coupled. Each interconnect structure is capable of coupling to at least one cell board. For instance, cell board connectors 2104 are shown for one interconnection structure and cell board connectors 2105 are shown for another interconnection structure of FIG. 21A. In various alternative implementations, the switching logic (such as logic 1903A-1903G in the example of FIG. 19C) may be included on either switch card 2101 or on interconnection structures 2102 and 2103. That is, in certain implementations, structure 2101 may be implemented as a passive interconnect board, while structures 2102 and 2103 are implemented as switch cards. To minimize the number of connections and routing complexity, structure 2101 is preferably implemented as a switch card while structures 2102 and 2103 are implemented as cell board interconnect structures, wherein such switch card 2101 is operable to route data between different ones of the interconnect structures 2102 and 2103.

Figure 21B:
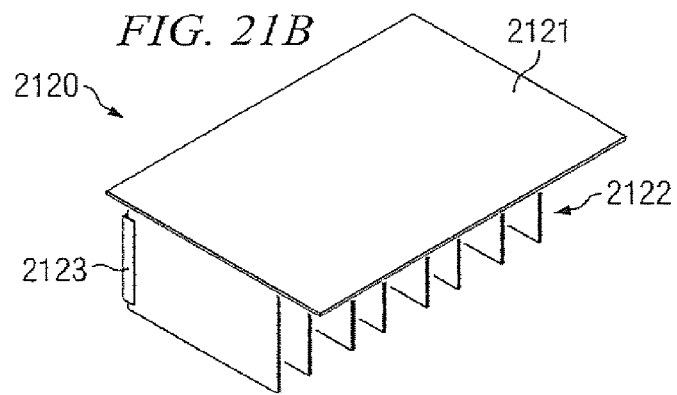
FIG. 21B shows another example 3D interconnection architecture in accordance with certain embodiments.

FIG. 21B shows another example 3D interconnection structure 2120 that includes switch board 2121 to which a plurality of cell board interconnect structures 2122 are coupled. Each interconnect structure is capable of coupling to at least one cell board. For instance, cell board connectors 2123 are shown for one interconnection structure of FIG. 21B. The example architecture of FIG. 21B is similar to the architecture of FIG. 21A, wherein switch board 2121 is analogous to switch board 2101 and interconnection structures 2122 are analogous to interconnection structures 2103.

Figure 21C:
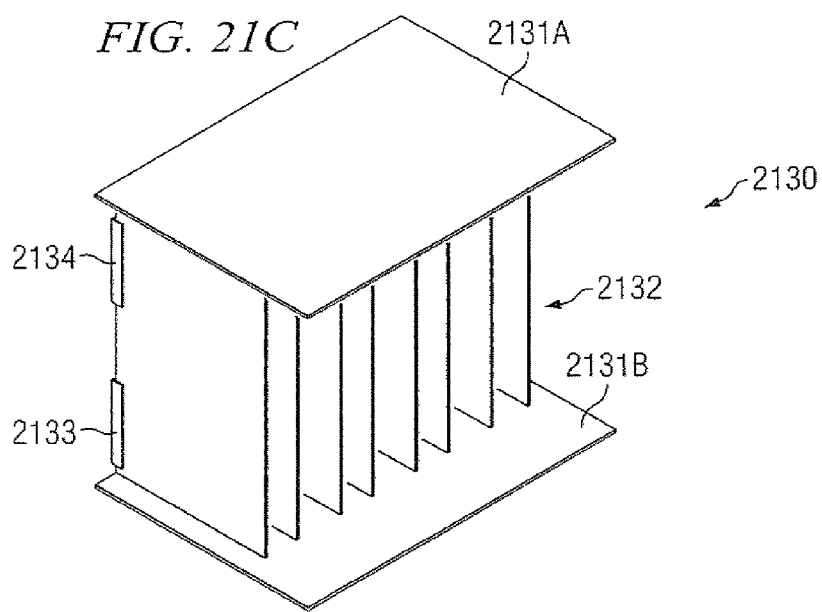
FIG. 21C shows another example 3D interconnection architecture in accordance with certain embodiments.

FIG. 21C shows another example 3D interconnection structure 2130 that includes switch boards 2131A and 2131B to which a plurality of cell board interconnect structures 22132 are coupled. Each interconnect structure is capable of coupling to at least one cell board. For instance, cell board connectors 2133 and 2134 are shown for coupling two cell boards to one interconnection structure of FIG. 21A. In various alternative implementations, the switching logic (such as logic 1903A-1903G in the example of FIG. 19C) may be included on either switch cards 2131A and 2131B or on interconnection structures 2132. Preferably, in the example architecture of FIG. 21C, switch cards 2131A and 2131B include the appropriate switching logic for routing data between different ones of the interconnect structures 2132.

Figure 22:
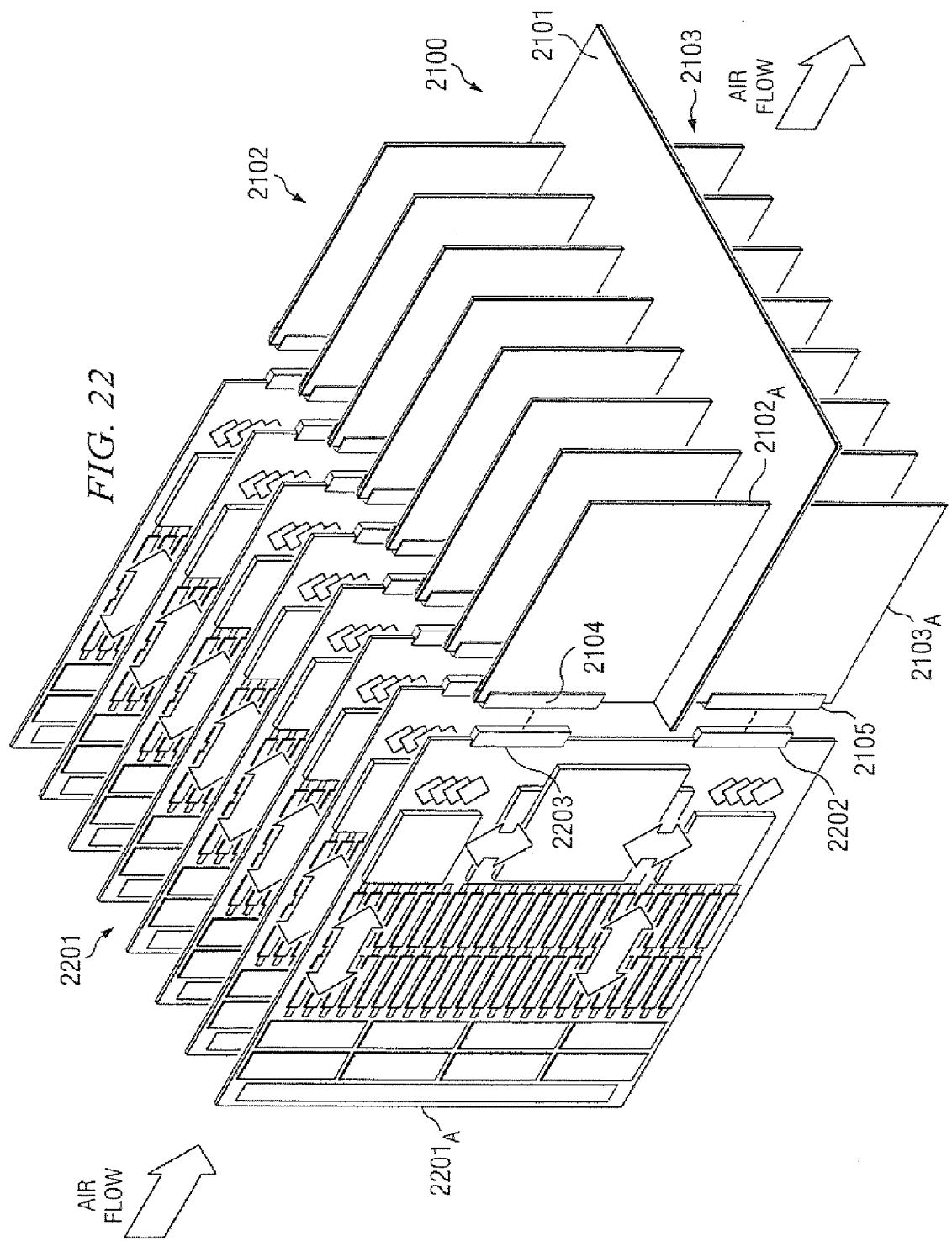
FIG. 22 shows an example of utilizing the example architecture of FIG. 21A for interconnecting a plurality of cell boards.

FIG. 22 shows an example of utilizing the architecture 2100 of FIG. 21A for interconnecting a plurality of cell boards 2201. As shown, a first cell board $2201_A$ is coupled to interconnect structures $2102_A$ and $2103_A$. More specifically, connectors 2203 of cell board $2201_A$ couple to connectors 2104 of interconnect structure $2102_A$, and connectors 2202 of cell board $2201_A$ couple to connectors 2105 of interconnect structure $2103_A$. In this example, switch card 2101 includes switching logic for routing data between any of the interconnect structures 2102 and 2103, thereby communicatively interconnecting the plurality of cell boards 2201. As shown, this example architecture permits font-to-back air flow, and the cell boards may be accessed (for service) in a common direction with the air flow (i.e., front-to-back).

FIG. 23 shows an example of utilizing the architecture 212 of FIG. 21B for interconnecting a plurality of cell boards 2301. In this example, two of the 3 D interconnection architectures are utilized, shown as architectures 2120A and 2120B. As shown each cell board is coupled to both interconnection architectures 2120A and 2120B. For instance, a first cell board $2301_A$ is coupled to interconnect structure 2122A of architecture 2120A and to interconnect structure 2122B of architecture 2120B. More specifically, connectors 2303 of cell board $2301_A$ couple to connectors 2123A of interconnect structure $2122_A$, and connectors 2302 of cell board $2301_A$ couple to connectors 2123B of interconnect structure $2122_B$. In this example, switch cards 2121A and 2121B each include switching logic for routing data between any of the plurality of cell boards 2301. As with the example of FIG. 22, this example architecture permits front-to-back air flow, and the cell boards may be accessed (for service) in a common direction with the air flow (i.e., front-to-back). Further, this example provides redundancy in that if one of switch cards 2121A and 2120B fails, the interconnection of cell boards 2301 is maintained. For instance, architecture 2120A may be serviced while architecture 2120B maintains communicative interconnection of the cell boards 2301. Accordingly, architecture 2120A may be serviced without requiring that the system be shut down.

Figure 24:
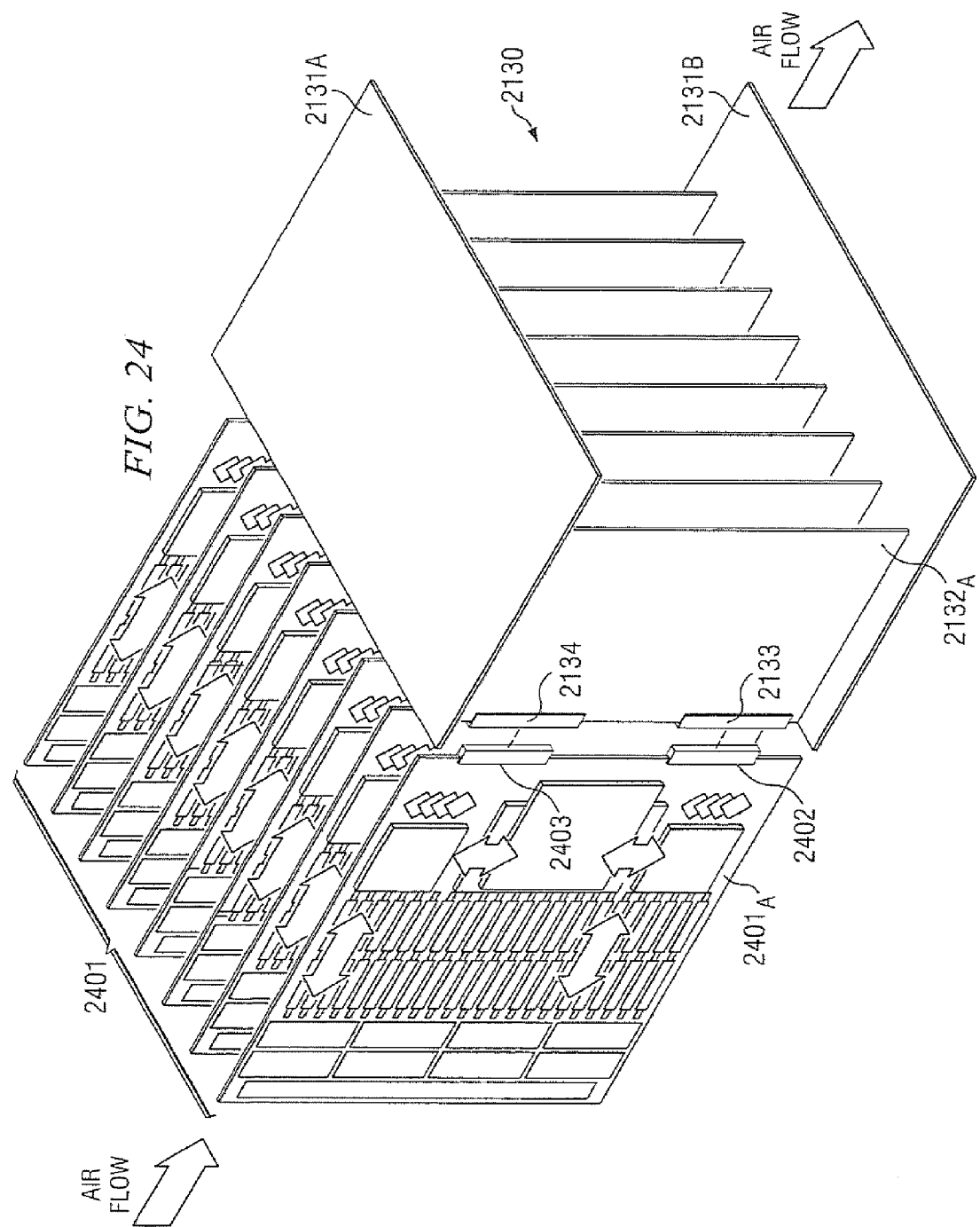
FIG. 24 shows an example of utilizing the example architecture of FIG. 21C for interconnecting a plurality of cell boards.

FIG. 24 shows an example of utilizing the architecture 2130 of FIG. 21C for interconnecting a plurality of cell boards 2401. As shown, each cell board is coupled to an interconnection structure. For instance, a first cell board $2401_A$ is coupled to a first interconnect structure $2132_A$, which is coupled to both switch cards 2131A and 2131B. More specifically, connectors 2403 of cell board $2401_A$ couple to connectors 2134 of interconnect structure $2132_A$, and connectors 2402 of cell board $2401_A$ couple to connectors 2133 of interconnect structure $2132_A$. In this example, switch cards 2131A and 2131B include switching logic for routing data between any of the interconnect structures 2132, thereby communicatively interconnecting the plurality of cell boards 2401. As shown, this example architecture permits front-to-back air flow, and the cell boards may be accessed (for service) in a common direction with the air flow (i.e., front-to-back). Additionally, his example provides redundancy in that if one of switch cards 2131A and 2131B fails, the interconnection of cell boards 2401 is maintained. While the example of FIG. 24 shows one cell board coupled to each interconnect structure, such as cell board 2401A connected to interconnect structure 2132A, in other implementations a plurality of cell boards may be coupled to each interconnect structure, such as with the example interconnect structure 1800 of FIGS. 18A-18B discussed above.

Figure 25:
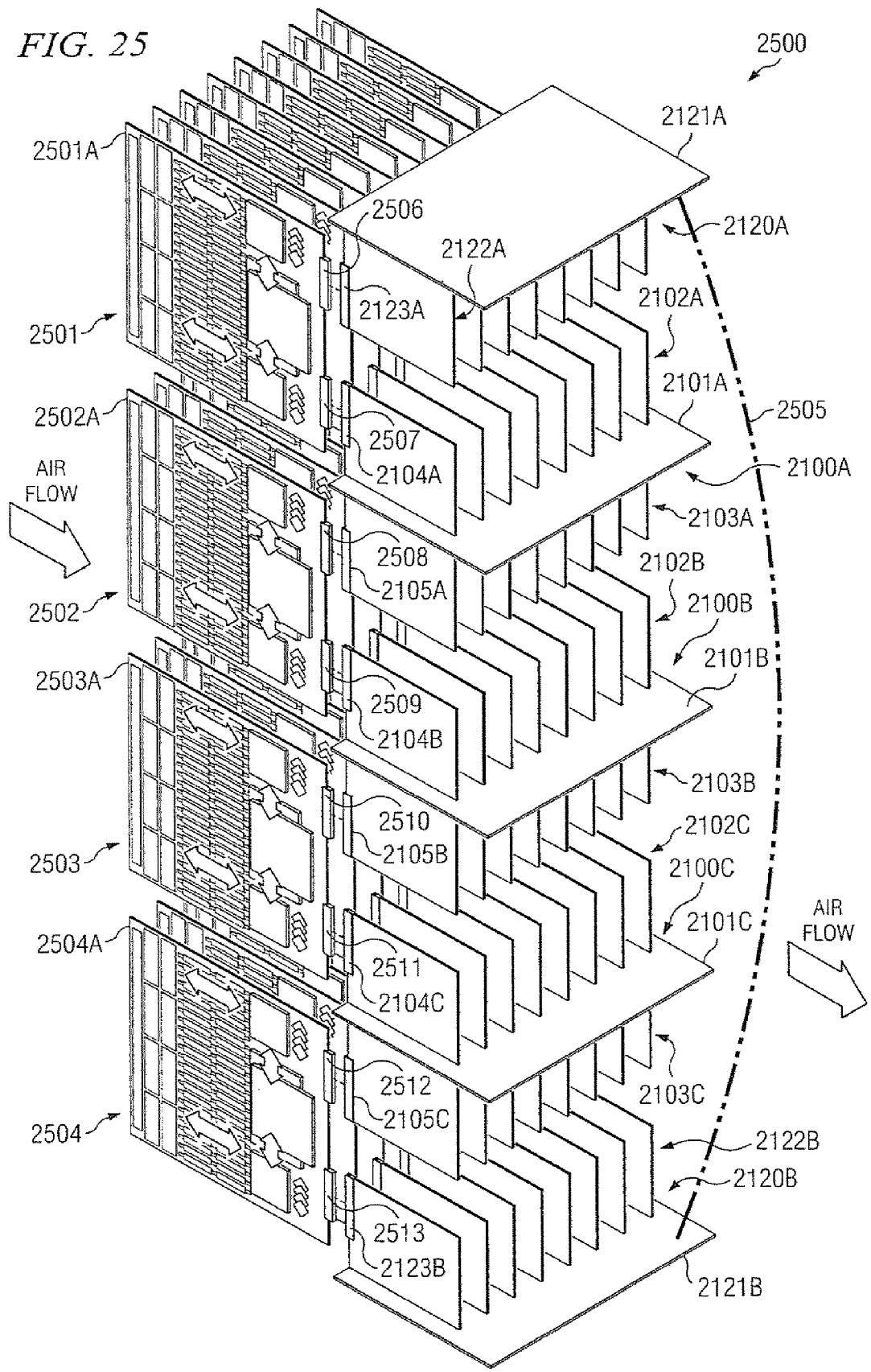
FIG. 25 shows an example cabinet having a plurality of cell boards communicatively interconnected with 3D interconnection architectures wherein each cell board is communicatively coupled to a plurality of different switch cards.

Turning to FIG. 25, an example cabinet 2500 that may be formed utilizing the interconnection architectures of FIGS. 21A and 21B is shown. In this example, interconnection architectures 2100 of FIG. 21A are used to straddle between different cell boards. That is, a first set of cell boards connect to the interconnection structures 2102 and a second set of cell boards connect to the interconnection structures 2103 of architecture 2100.

More specifically, in the example of FIG. 25, a first interconnection structure 2120A (of FIG. 21B) connects to a first set of cell boards 2501. That is, each cell board of set 2501 connects to one of interconnection structures 2122A, which are each coupled to switch card 2121A. For instance, cell board 2501A is coupled to a first one of interconnection structures 2122A via coupling of the cell board's connectors 2506 with the connectors 2123A.

The first set of cell boards 2501 also couple to interconnection structures 2102A of architecture 2100A (of FIG. 21A). That is, each cell board of set 2501 connects to one of interconnection structures 2102A, which are each coupled to switch card 2101A. For instance, cell board 2501A is coupled to a first one of interconnection structures 2102A via coupling of the cell board's connectors 2507 with the connectors 2104A. A second set of cell boards 2502 couple to interconnection structures 2103A of architecture 2100A. That is, each cell board of set 2502 connects to one of interconnection structures 2103A, which are each coupled to switch card 2101A. For instance, cell board 2502A is coupled to a first one of interconnection structures 2103A via coupling of the cell board's connectors 2508 with the connectors 2105A. Thus, interconnection architecture 2100A straddles the first set of cell boards 2501 and the second set of cell boards 2502, which enables interconnection of such first and second sets of cell boards in a manner that minimizes cabling within cabinet 2500.

The second set of cell boards 2502 also couple to interconnection structures 2102B of architecture 2100B. That is, each cell board of set 2502 connects to one of interconnection structures 21012B, which are each coupled to switch card 21013B. For instance, cell board 2502A is coupled to a first one of interconnection structures 2102B via coupling of the cell board's connectors 2509 with the connectors 2104B. A third set of cell boards 2503 couple to interconnection structures 2103B of architecture 2100B. That is, each cell board of set 2503 connects to one of interconnection structures 21031B, which are each coupled to switch card 2101B. For instance, cell board 2503A is coupled to a first one of interconnection structures 2103B via coupling of the cell board's connectors 2510 with the connectors 2105B. Thus, interconnection architecture 2100B straddles the second set of cell boards 2502 and the third set of cell boards 2503, which enables interconnection of such second and third sets of cell boards in a manner that minimizes cabling within cabinet 2500.

The third set of cell boards 2503 also couple to interconnection structures 2100C of architecture 2100C. That is, each cell board of set 2503 connects to one of interconnection structures 2102C, which are each coupled to switch card 2101C. For instance, cell board 2503A is coupled to a first one of interconnection structures 2102C via coupling of the cell board's connectors 2511 with the connectors 2104C. A fourth set of cell boards 2504 couple to interconnection structures 2100C of architecture 2100C. That is, each cell board of set 2504 connects to one of interconnection structures 2103C, which are each coupled to switch card 2101C. For instance, cell board 2504A is coupled to a first one of interconnection structures 2103C via coupling of the cell board's connectors 2512 with the connectors 2105C. Thus, interconnection architecture 2100C straddles the third set of cell boards 2503 and the fourth set of cell boards 2504, which enables interconnection of such third and fourth sets of cell boards in a manner that minimizes cabling within cabinet 2500.

In this example, an interconnection architecture 2120B (of FIG. 21B) connects to the fourth set of cell boards 2504. That is, each cell board of set 2504 connects to one of interconnection structures 2122B, which are each coupled to switch card 2121B. For instance, cell board 2504A is coupled to a first one of interconnection structures 2122B via coupling of the cell board's connectors 2513 with the connectors 2123B. Further, in this example, interconnection structure 2120A and 2120B are coupled together via coupling 2505 (e.g., cabling, such as a copper or fiber optic wire), which provides redundancy. That is, by having the top interconnection structure 2120A and the bottom interconnection structure 2120B communicatively connected, an alternative route is provided for routing data between the cell boards when one of the middle structures has failed. For instance, suppose that interconnection structure 2100A has failed; in this case, data may be routed between the cell boards of set 2501 and any of the other sets of cell boards via coupling 2505 (and in some instances, depending on the other cell board with which set 2501 is communicating, one or more of the structures 2100B and 2100C). Thus, any one of structures 2120A, 2120B, 2120A, 2100B, and 2100C may be serviced/replaced without shutting down the system in this example, as an alternative route exists around each of the structures. Further, this example architecture permits front-to-back air flow, and the cell boards may be accessed (for service) in a common direction with the air flow (i.e., front-to-back).

Figure 26:
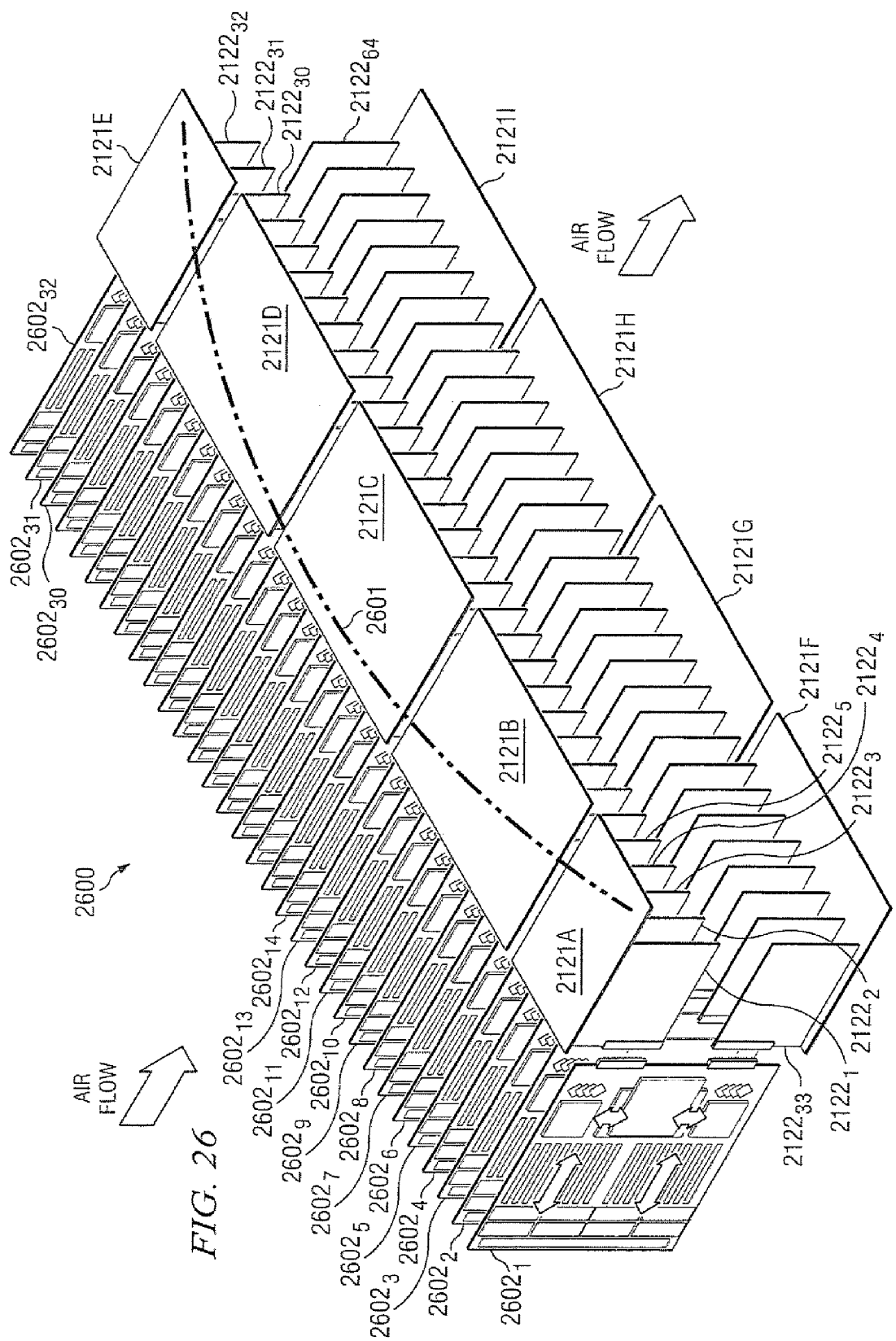
FIG. 26 shows another example cabinet having a plurality of cell boards communicatively interconnected with 3D interconnection architectures wherein each cell board is communicatively coupled to a plurality of different switch cards.

As described above, FIG. 25 provides an example in which switch cards are arranged straddled between different cell boards. For instance, switch card 2101A is arranged to communicatively straddle between a first set 2501 of cell boards and a second set 2502 of cell boards, which are coupled to interconnection cards 2102A and 2103A, respectively. FIG. 26 provides an example cabinet 2600 in which switch cards are arranged staggered relative to each other.

More specifically, the example implementation of FIG. 26 communicatively interconnects 32 cell boards (shown as cell boards $2602_1$-$2602_{32}$). Of course, in other implementations any number of cell boards may be interconnected in this manner. As shown, each cell board connects to two interconnection structures, which in turn each connect to a separate switch card. For instance, cell board $2602_1$ connects to interconnection structure $2122_1$, which is connected to switch card 2121A, and cell board $2602_1$ also connects to interconnection structure $2121_{33}$, which is connected to switch card 2121F. As can be seen, this example utilizes the example structures of FIG. 21B, wherein each cell board connects to two of such structures, an upper and a lower structure. The switch cards of the upper and lower structures are staggered, as discussed further below.

The upper structures in the example of FIG. 26 include switch cards 2121A-2121E. Cell boards $2602_1$-$2602_{32}$ are each communicatively coupled to switch cards 2121A-2121E via interconnection structures $2122_1$-$2122_{32}$. The lower structures in the example of FIG. 26 include switch cards 2121F-2121I. Cell boards $2602_1$-$2602_{32}$ are each communicatively coupled to such switch cards 2121F-2121I via interconnection structures $2122_{33}$-$2122_{64}$. Again, the switch cards of the upper and lower structures are arranged staggered relative to each other in this example.

For instance, in this example implementation, switch card 2121A has five interconnection structures, $2122_1$-$2122_5$, coupled thereto, for communicatively coupling cell boards $2602_1$-$2602_5$ to such switch card 2121A. Switch card 2121B has eight interconnection structures, $2122_6$-$2122_{13}$, coupled thereto, for communicatively coupling cell boards $2602_6$-$2602_{13}$ to such switch card 2121B. Similarly, switch card 2121C has eight interconnection structures, $2122_{14}$-$2122_{21}$, coupled thereto, for communicatively coupling cell boards $2602_{14}$-$2602_{21}$ to such switch card 2121C, and switch card 2121D has eight interconnection structures, $2122_{22}$-$2122_{29}$, coupled thereto, for communicatively coupling cell boards $2602_{22}$-$2602_{29}$ to such switch card 2121D. Switch card 2121E has three interconnection structures, $2122_{30}$-$2122_{32}$, coupled thereto, for communicatively coupling cell boards $2602_{30}$-$2602_{32}$ to such switch card 2121E.

The switch cards of the lower structure are arranged staggered relative to the switch cards of the upper structure. For instance switch cards 2121F-2121I each have eight interconnection structures coupled thereto, for communicatively coupling cell boards to them. That is, switch card 2121F has eight interconnection structures, $2122_{33}$-$2122_{40}$, coupled thereto, for communicatively coupling cell boards $2602_1$-$2602_8$ to such switch card 2121F; switch card 2121G has eight interconnection structures, $2122_{41}$-$2122_{48}$, coupled thereto, for communicatively coupling cell boards $2602_9$-$2602_{16}$ to such switch card 2121G; switch card 2121H has eight interconnection structures, $2122_{49}$-$2122_{56}$, coupled thereto, for communicatively coupling cell boards $2602_{17}$-$2602_{24}$ to such switch card 2121H; and switch card 2121I has eight interconnection structures, $2122_{57}$-$2122_{64}$, coupled thereto, for communicatively coupling cell boards $2602_{25}$-$2602_{32}$ to such switch card 2121I.

Thus, switch card 221F overlaps (or is staggered) with switch cards 2121A and 2121B. That is, switch card 2121F is communicatively coupled to cell boards $2602_1$-$2602_8$, while cell boards $2602_1$-$2602_5$ also couple to switch card 2121A and cell boards $2602_6$-$2602_8$ also couple to switch card 2121B. Further in this example, switch cards 2121A and 2121E are coupled together via coupling 2601 (e.g., cabling, such as a copper or fiber optic wire), which provides redundancy. That is, by having switch cards 2121A and 2121E communicatively connected, an alternative route is provided for routing data between the cell boards $2602_1$-$2602_{32}$ when one of the switch cards 2121A-2121I has failed. Thus, redundancy is provided for enabling any one of cell boards $2602_1$-$2602_{32}$ to communicate with any other of cell boards $2602_1$-$2602_{32}$ with any one of the switch cards 2121A-2121I having failed. Thus, any one of switch cards 2121A-2121I may be serviced/replaced without shutting down the system in this example, as an alternative route exists around each of the switch cards. Further, this example architecture permits front-to-back air flow, and the cell boards may be accessed (for service) in a common direction with the air flow (i.e., front-to-back).

What is claimed is:

1. A computer system comprising:
   a plurality of first cell boards, each first cell board defined by a peripheral edge that surrounds a first cell board planar surface;
   a first interconnect card defined by a peripheral edge that surrounds a first interconnect card planar surface,
   wherein the first cell boards are coupled to the first interconnect card such that a portion of the peripheral edge of each of the first cell boards faces a portion of the peripheral edge of the first interconnect card, and the first cell board planar surfaces and the second interconnect card planar surface together define a first common plane, the first interconnect card providing routing between the first cell boards;
   a plurality of second cell boards, each second cell board defined by a peripheral edge that surrounds a second cell board planar surface;
   a second interconnect card defined by a peripheral edge that surrounds a second interconnect card planar surface,
   wherein the second cell boards are coupled to the second interconnect card such that a portion of the peripheral edge of each of the second cell boards faces a portion of the peripheral edge of the second interconnect card, and the second cell board planar surfaces and the second interconnect card planar surface together define a second common plane, the second interconnect card providing routing between the second cell boards;
   a first switch card defined by a peripheral edge that surrounds a first switch card planar surface; and
   a second switch card defined by a peripheral edge that surrounds a second switch card planar surface,
   wherein the first switch card and the second switch card are arranged such that the first and second switch card planar surfaces define a common switch card plane, and wherein the first switch card and the second switch card each provides routing for at least some of the first cell boards and at least some of the second cell boards.

2. The computer system as recited in claim 1, wherein the first switch card is coupled to the first interconnect card.

3. The computer system as recited in claim 2, wherein the first switch card planar surface of the first switch card is perpendicular to the first common plane and the second common plane.

4. The computer system as recited in claim 3, wherein the first common plane and the second common plane are spaced apart and parallel to each other.

5. The computer system as recited in claim 4, wherein an airflow is directed between the first common plane and the second common plane.

6. The computer system as recited in claim 3, wherein the second switch card is coupled to the first and second interconnect cards.

7. The computer system as recited in claim 2, wherein the first cell boards and the first interconnect card are a first horizontal unit, and the second cell boards and the second interconnect card are a second horizontal unit.

8. The computer system as recited in claim 7, wherein the first switch card is adapted to accommodate at least one more horizontal unit.

9. The computer system as recited in claim 1, wherein each of the first cell boards includes a plurality of processors and a memory subsystem.

* * * * *